United States Patent [19]

Plumb et al.

[11] Patent Number: 4,754,200
[45] Date of Patent: Jun. 28, 1988

[54] SYSTEMS AND METHODS FOR ION SOURCE CONTROL IN ION IMPLANTERS

[75] Inventors: Frederick Plumb, Horsham; Christopher Wright, Findon; Nicholas J. Bright, Cowfold; Derek Aitken, Dorking; Bernard Harrison, Crawley, all of England

[73] Assignee: Applied Materials, Inc., Santa Clara, Calif.

[21] Appl. No.: 774,110

[22] Filed: Sep. 9, 1985

[51] Int. Cl.[4] .......................... H01J 7/24; H05B 31/26
[52] U.S. Cl. ............................ 315/111.81; 250/423 R; 315/106; 315/107; 315/111.91; 315/307
[58] Field of Search ...................... 315/111.71, 111.81, 315/111.91, 106, 107, 307, 308; 250/423

[56] References Cited

U.S. PATENT DOCUMENTS

| | | | |
|---|---|---|---|
| 3,413,517 | 11/1968 | Barber et al. | 315/107 |
| 4,090,106 | 5/1978 | Okumura et al. | 315/307 |
| 4,126,814 | 11/1978 | Marlowe | 315/307 |
| 4,253,048 | 2/1981 | Osako | 315/307 |
| 4,398,132 | 8/1983 | Razin et al. | 315/106 |
| 4,421,993 | 12/1983 | Bloomer | 315/308 |
| 4,454,453 | 6/1984 | Sugawara | 315/106 |

Primary Examiner—Saxfield Chatmon
Attorney, Agent, or Firm—Flehr, Hohbach, Test, Albritton & Herbert

[57] ABSTRACT

A method for operating an ion source having a filament-cathode and an anode. The method includes supplying direct current electrical power between the anode and the filament-cathode characterized by substantially constant arc current there between and varying arc voltage on the filament-cathode. Direct current electrical power is also supplied across the filament-cathode. The value of the arc voltage is monitored and the magnitude of electrical power supplied to the filament-cathode is altered in response to detected changes in the arc voltage to return the arc voltage to substantially a preset reference value. The monitoring step and the altering step are carried out at regular preset intervals. The altering step includes deriving an filament power error signal as a prearranged function which includes the difference in values between the monitored arc voltage and the preset reference value multiplied by a predefined integral gain value. The altering step also includes altering the magnitude of electrical power supplied to the filament-cathode by the value of the filament power error signal.

19 Claims, 11 Drawing Sheets

SYSTEMS AND METHODS FOR ION SOURCE CONTROL IN ION IMPLANTERS

BACKGROUND OF THE INVENTION

This invention relates generally to ion implantation systems and, specifically, to control of ion source systems in ion implanters. More specifically, this invention relates to systems and methods for controlling a Freeman type ion source in manner which facilitates automation of ion beam generation as well as overall control of an ion implantation system.

DISCUSSION OF BACKGROUND AND PRIOR ART

The manufacture of large scale integrated circuit (LSIC) chips has become one of the most important industries in the world over the past ten or fifteen years. This technology has produced the dramatic improvement in performance at lower cost of both mainframe and minicomputer systems as well as the microcomputer systems which are proliferating in the home computer and professional office computer field. LSIC technology has also made significant advanced in performance and cost reduction in telecommunications and real time control systems for industrial processes and equipment. To understand the importance of this invention in the LSIC field, some background information on integrated circuit manufacture will be helpful.

Use Of Ion Implantation In Semiconductor Processing Very great improvements in the scale of integration of semiconductor devices on IC chips and the speed of operation of such devices have been achieved over the past several years. These improvements have been made possible by a number of advances in IC manufacturing equipment as well as improvements in the materials and methods utilized in processing virgin semiconductor wafers into IC chips. The most dramatic advances in semiconductor manufacturing equipment have involved systems for lithography and etching of circuit patterns on semiconductor wafers and systems for implanting ions of conductivity modifying impurities into the semiconductor wafers.

Integrated circuit density and speed of operation are both dependent largely upon accuracy and resolution of the lithography and etching systems used to form the patterns of circuit elements in photoresist masking layers on the semiconductor wafer. However, density and speed are also dependent upon tight control of the profile of doped regions in the semiconductor wafer. Doped regions are regions in which substantial concentrations of conductivity modifying impurities have been added.

Tight control of wafer doping can best be achieved using ion implantation techniques and equipment. The uniformity of doping achievable only with ion implantation is critical in the fabrication of smaller geometry devices. It is also critical in the fabrication of devices where a large number of critical implant steps are required. Doping uniformity across individual wafers and repeatability of dopant levels and uniformity from wafer to wafer are critical to high fabrication yields of high density devices. These results can only be achieved using ion implantation.

Desirable Features of Ion Implantation Systems

One of the strong desiderata in the field of manufacturing LSIC devices using ion implantation techniques is to improve the wafer throughput capability of the ion implanter while maintaining quality of the implant and without dramatically increasing the cost of performing the implants, especially the cost of performing heavy dose implants which are becoming more popular in the LSIC manufacturing process. The principal parameter which determines wafer throughput in an ion implanter, especially in a heavy implant operation of the system, is ion beam current. The present generation of ion implanters involve a number of different systems of widely varying ion beam current generating capacity, with systems generally being categorized as low current, medium current and high current machines.

Most of the commercial systems in use today utilize a Freeman ion source to generate a plasma of ions in an arc chamber with an extraction and acceleration electrode system utilized to extract a beam of such ions out of the ion chamber and directed toward an analyzing magnet system to sort out the chemical species in the ion beam of interest before directing the beam onto a target wafer. While the Freeman ion source has proven to be a workhorse in the field of ion implantation equipment and is capable of producing arc currents over a wide range of values, it is also well-known that the Freeman ion source is often difficult to control and erratic in its operation.

This invention is particularly directed to meeting the performance challenges involved in high current ion implantation systems using Freeman ion sources. High current ion implantation machines, in the parlance of the current commercial state of the art are considered to be machines which generate useful boron ion beam currents of about two or three milliamperes (mA) and about ten to twelve mA of arsenic ion beam current. These are the actual ion beam currents striking the semiconductor wafer and it will be appreciated that the arc currents involved in the plasma created within the ion source itself will be at much higher levels and often will involve current levels of one amp or more. For flexibility in generating ion beams of different current levels, the ion source system must be capable of stable operation over a wide range of arc currents with different ion species. Moreover, the ion source must be capable of stable operation over the entire typical life cycle of operation of a source with a particular filament.

As the ion implantation industry develops higher and higher beam current capacity, it will be necessary to drive the ion source harder without introducing arc instability factors which could affect the stability of the ion beam and thus the quality of the implant being performed by the system.

A copending and commonly assigned U.S. patent application of Derek Aitken entitled APPARATUS AND METHODS FOR ION IMPLANTATION, U.S. application Ser. No. 641,027 filed Aug. 15, 1984, discloses ion beam line technology capable of generating useful ion beam currents several times greater in magnitude than current commercial state of the art technology. More specifically, boron ion beam currents in excess of ten mA and arsenic ion beam currents in excess of thirty mA are achievable using the novel io optics techniques and ion beam line component technology disclosed in the Aitken application. This increase in beam current is achieved without substantial scale up of size of beam line components. This technology will herein be referred to as the Aitken very high current beam current technology. Ion beam currents at these levels will result in a new generation of ion implantation apparatus which will dramatically improve wafer throughput. Improved technology for wafer scanning for such a new generation of ion implantation equipment is disclosed in a copending and commonly assigned application of Robinson, et al., Ser. No. 774,192 filed 9/9/85 and entitled SYSTEMS AND METHODS FOR ION IMPLANTATION OF SEMICONDUCTOR WAFERS. Advanced techniques for wafer handling in such a new generation of ion implantation equipment is disclosed in a copending and commonly assigned application of Stonestreet, et al., Ser. No. 774,209 filed 9/9/85 entitled SYSTEMS AND METHODS FOR WAFER HANDLING IN SEMICONDUCTOR PROCESS EQUIPMENT.

Advanced generations of ion implantation systems will demand increasing degrees of automation of the setup and control of the entire system. Since generation of the ion current in the ion source subsystem of an ion implanter lies at the very heart of the overall system performance, automation of the setup and control of the ion source is a crucial aspect of achieving overall system automation.

FIG. 1 illustrates, for purposes of example, the basic ion beam line subsystems of an ion implanter. The particular subsystems disclosed in FIG. 1 show the ion optics geometry of the above-referenced Aitken application. The ion source structure and arrangement itself is a typical Freeman ion source arrangement. FIG. 2 schematically illustrates from a conceptual standpoint, the control of a Freeman ion source utilizing a prior art approach.

Referring to FIGS. 1 and 2, ions are generated in the arc chamber 15 of the Freeman ion source. An extraction electrode assembly 13 extracts a beam of ions through a rectangular aperture 15A in the front of the arc chamber 15. The ion beam is both extracted and accelerated toward the mass analyzing system 20 which includes an ion beam flight tube 21 providing a path between the poles of analyzing magnet assembly 22. The ion beam is bent in passing through the analyzing magnet assembly 22, enters an ion drift tube 32, passes through a mass resolving slit 33, is accelerated in a post acceeration system 40, and strikes a target element 50. Ion source assembly 11 includes a magnet assembly 12 which has separate electromagnets with cylindrical poles 412A having their axis aligned with the filament 15B within the arc chamber 15. The source magnets produce higher efficiency of ion generation by causing electrons emitted from the filament 15B to spiral around the filament in a path to the anode and thus increase the ionization efficiency in the source. However, hard driving of the source magnets can affect arc stability.

As shown in FIG. 2, the Freeman ion source is operated from an electrical standpoint by coupling a filament power supply 60 across the filament 15B to supply high current at low voltage to the filament. An arc power supply 61 applies a voltage, which is typically clamped to a maximum of about one hundred and seventy volts, between the filament 15B and the anode 15C within arc chamber 15. Filament 15B generates thermal electrons which are accelerated through the gas species within the arc chamber toward the anode 15C in a spiraling path to create a plasma of the ion species within the arc chamber 15. A separate arc chamber power supply 62 provides a pre-analysis acceleration voltage of up to forty kilovolts to the arc chamber 15. Another separate power supply 63 provides a slightly negative voltage of around minus two kilovolts to extraction electrode 13A, also known as the focus electrode. The final electrode 13B is biased at terminal ground so that the final ion beam acceleration is determined by the value of the pre-analysis acceleration voltage applied to the arac chamber itself.

As shown in FIG. 2, the servo control theory implemented in the prior art in an attempt to control and stabilize the operation of the ion source utilizes a constant arc voltage operating mode. An arc voltage error circuit 64 detects the difference between the demanded arc voltage and the actual arc voltage applied between the filament and the anode. Operating in a fast servo loop, the error signal from the arc voltage error circuit 64 controls the arc power supply to maintain the arc voltage at a leverl very close to the arc voltage damand signal.

Since, for stable ion source operation, it is necessary to keep both the arc voltage and arc current relatively constant, the control of arc current in the prior art approach utilized a feedback loop which controlled filament power. In other words, if the arc current dropped, the arc current measuring circuit 65 together with arc current error circuit 66 would attempt to alter the filament power by way of the filament power control circuit 67 to bring the actual arc current back to the level of the demanded arc current. Because of the thermal inertia of a high resistance filament, the filament power control loop for maintaining constant arc current is a very slow control loop and is subject to a number of problems and limitations.

This prior art control approach is prone to produce low frequency arc current oscillations particularly as the length of the filament increases. The arc current loop response is very slow and this can result in a thermal runaway situation under certain conditions when the control scheme becomes totally unstable. With this approach an arc current ripple cannot be directly controlled. At low arc voltages the arc tends to extinguish when this control method is used. Even with low source magnet currents a large amount of hash-type noise in the system is generated. In general, this constant voltage filament control mode of operation can only be satisfactorily utilized to give controllable arcs between about 100 mA and one amp of arc current.

Because of the difficulties of accurate arc current control even at small arc current and the instabilities in the control scheme for large arc currents, this prior art approach is marginal for ion implanters in the three to ten mA beam current range and is entirely unsuitable for use in a higher current ion implantation system utilizing the Aitken super high beam current technology.

Another problem with the prior art ion source and extraction system shown in FIG. 2 is the tendency for sparking between the arc chamber 15 and the extraction electrode 13A. It is well known that, because of the dirty atmosphere within an ion source assembly, it is prone to sparking which can have a deleterious effect on the ion beam because the sparking causes the pre-analysis acceleration voltage applied to the arc chamber to drop as the arc chamber power supply runs out of current capacity. This produces a change in the overall beam acceleration voltage so that the preselected chemical species of the ion beam is no longer focused through the resolving slit while the sparking is occurring.

Since the stability of an ion beam extracted from a Freeman ion source is largely dependent upon having a stable arc current within the source and since ion beam purity is an important consideration in maintaining the quality of the implant, it will be appreciated that improvements in the prior art ion source control schemes and electrode biasing schemes are necessary to achieve the levels of automation needed to ion implantation systems and the levels of beam quality which are demanded by advanced LSIC processes.

Therefore it is the principal object of this invention to provide an improved system and method for control of a Freeman type ion source.

It is another object of this invention to provide a system and method for control of a Freeman type ion source which is readily adaptable to totally automated computer control.

It is another object of this invention to provide a system and method for ion source control which can handle the arc current levels required in the Aitken super high beam current technology.

It is another object of this invention to provide improved systems and methods for management of delatching of an ion beam in an automated fashion integrated with ion source control.

SUMMARY OF THE INVENTION

One aspect of this invention features a method for operating an ion source having a filament-cathode and an anode mounted within the ion source chamber which includes the steps of supplying direct current electrical power between the anode and the filament-cathode characterized by substantially constant arc current therebetween and varying arc voltage on the filament-cathode and supplying direct current electrical power across the filament-cathode. In this method, the value of the arc voltage is monitored and the magnitude of electrical power supplied to the filament-cathode is altered in response to detected changes in the arc voltage to return the arc voltage to substantially a preset reference value.

Preferably the monitoring step and the altering step are carried out at regular preset intervals. Also the altering step preferably includes two steps. The first step is to derive a filament power error signal as a prearranged function which includes the difference in values between the monitored arc voltage and the preset reference value multiplied by a predefined integral gain value. The second step is to alter the magnitude of electrical power supplied to said filament-cathode by the value of the filament power error signal.

It is also preferable that the step of supplying power between the anode and the filament-cathode comprise three separate steps. The first is to monitor the value of arc current flowing between the anode and the filament-cathode. The second is to derive an arc current error signal as a function of the difference between the monitored arc current value and a preset arc current demand signal. The third is to alter the voltage supplied to the filament-cathode as a function of the arc current error signal until the monitored arc current is equal to the arc current demand signal.

The method of this invention may be applied to operating an ion source and extracting an ion beam therefrom. An extraction electrode is disposed adjacent the ion source. A deceleration electrode is disposed adjacent the extraction electrode. A direct current electrical potential is supplied to the ion source at a first positive voltage level and a direct current electrical potential is supplied to the extraction electrode at a negative voltage level to extract a beam of ions from the ion source. The method further includes detecting a potential beam latching condition in which the ion beam is striking the extraction electrode to provide a latch detect signal and momentarily altering the voltage supplied to the filament-cathode in response to the latch detect signal to momentarily turn down the arc current to prevent or remedy the latching condition. While the latch detect signal is present, the monitoring and altering steps are interrupted to maintain the filament power value at the value set during the last execution of those steps.

Another aspect of this invention features a method for starting and operating an ion source having a filament-cathode and an anode housed in an ion source chamber to reach and maintain a stable preset arc current value and a stable preset arc voltage value. In this method a direct current voltage is applied across the filament-cathode and anode at a initial maximum Varc value in excess of the preset arc voltage value. Also direct current power is applied to the filament-cathode at an initial value below a power level required to initiate an arc in the ion chamber. Monitoring arc current in the chamber is done at regular preset intervals to determine whether arc current of a preset minimum value is present. At the end of each of the preset monitoring intervals an incrementally increased value of direct current power is applied to the filament-cathode until an arc current of the preset minimum value is detected in the monitoring step.

After the arc is struck in this manner the arc voltage control method discussed above is used to bring arc current to a preset value and then bring arc voltage to a preset value and thereafter to maintain such values.

Another aspect of this invention features an ion source operating system which combines an ion source having a chamber with a filament-cathode and an anode mounted within the chamber with an arc power supply arrangement and a filament power supply arrangement of special characteristics. The arc power supply arrangement supplies direct current electrical power between the anode and the filament-cathode and includes a circuit arrangement for maintaining substantially constant arc current flowing between the anode and the filament-cathode with accompanying variations in the arc voltage on the anode. The filament power suply arrangement supplies a value of direct current electrical power across the filament-cathode in response to a filament power control signal. An arrangement is provided for monitoring the value of the arc voltage on the anode; and a further arrangement is provided for developing an filament power error signal as a predefined function of the difference between the arc voltage value and a reference arc voltage value. Finally a circuit arrangement is provided for altering the mangitude of electrical power supplied to the filament-cathode as a function of the filament power error signal to return the arc voltage to the reference arc voltage value.

In a preferred embodiment the arc power supply means comprises these three elements: (1) an arc power supply for supplying a dc voltage between said filament-cathode and the anode and responsive to an input control signal to vary the arc voltage on the filament-cathode; (2) a circuit coupled to the arc power supply and the anode for producing an arc current signal corresponding to the value of the arc current; and (3) an error circuit receiving the arc current signal and a preset arc current demand signal for supplying the input control signal to the arc power supply as a signal with a value proportional to the difference between the arc current signal and the arc current demand signal.

The arc power supply thereby responds to the control signal to alter the arc voltage until the arc current signal is equal to the arc current demand signal.

In a preferred embodiment, the altering arrangement comprises five elements. First, a circuit coupled to the filament-cathode produces a filament current value signal. Another circuit derives a filament voltage signal. A power circuit receives the filament current signal and the filament voltage signal and produces a filament power signal. Another circuit arrangement responds to the filament power error signal and develops a filament power demand signal. Finally, an error circuit receives the filament power signal and the filament power demand signal and produces a control signal to the filament power supply with a magnitude proportional to the difference in values between the filament power signal and the filament power demand signal to thereby cause the filament power supply to alter the power applied to the filament until the values of the filament power signal and the filament power demand signal are equal.

The overall preferred system embodiment of this invention utilizes programmed computer control of the filament power to achieve arc voltage control with a hardward servo loop maintaining arc current constant in an ion source having a chamber with a filament-cathode and an anode mounted within the chamber. In this embodiment an arc power supply means supplies direct current power between the filament-cathode and the anode and is responsive to an input control signal to control the arc voltage applied to the filament-cathode. An arc current detect circuit coupled to the filament-cathode and the arc power supply produces an arc current signal having a value corresponding to the value of arc current flowing between the filament-cathode and the anode. A first error circuit is provided with an arc current demand input lead and is coupled to the arc current detect circuit means for supplying the input control signal to the arc power supply means as a signal value proportional to the difference between the arc current signal and the signal value on the arc current demand lead to cause the arc power supply to alter the arc voltage until the arc current demand value and the arc current value are equal or the arc voltage is at a maximum value.

A filament power supply supplies direct current electrical power across the filament-cathode and is responsive to an input control signal to control the amount of power applied to the filament. On a filament power control board, a filament power detect circuit is coupled to the filament-cathode for detecting the value of power being consumed in the filament. A second error circuit is provided and includes a filament power demand input lead. This error circuit is coupled to the filament power detect circuit for supplying the input control signal to the filament power supply means as a signal value proportional to the difference between the filament power value and the signal value on the filament power demand input lead sent from the computer to cause the filament power supply to alter the electrical power applied to the filament until the filament power value and the filament power demand value are equal.

The programmable computer system includes input circuits communicating with the arc power supply and the filament power detect circuit for inputting values of arc current and filament power, output circuits communicating with the first and second error circuits for outputting values of arc current demand and filament power demand thereto, and memory circuit means for storing values of arc current reference demand and arc voltage reference demand and other predefined variables. The computer system further includes a program arrangement for sending an arc current demand signal value to the first error circuit to establish the arc current at the value and for executing a filament power setting control routine at preset time intervals. This routine includes inputting the value of arc voltage, calculating the absolute value of the fractional error between the input arc voltage value and the stored arc voltage reference demand value, calculating a new filament power demand value as a prearranged function which includes a prearranged gain factor times the difference between input arc voltage and stored arc voltage reference, and communicating the new filament power demand signal to the second error circuit.

The features of this invention provide the advantage of very effective control of the ion source and related ion beam extraction components and facilitates total computer controlled automation of this aaspect of ion implanter operation. The invention solves all of the problems which are inherent in prior art control schemes and can be used over a wide range of arc variables of current and voltage.

Other object and features and advantages of this invention will be discussed below in the detailed description of embodiments of the invention in conjunction with the drawings.

DETAILED DESCRIPTION OF EMBODIMENTS OF THE INVENTION

Figure 3:
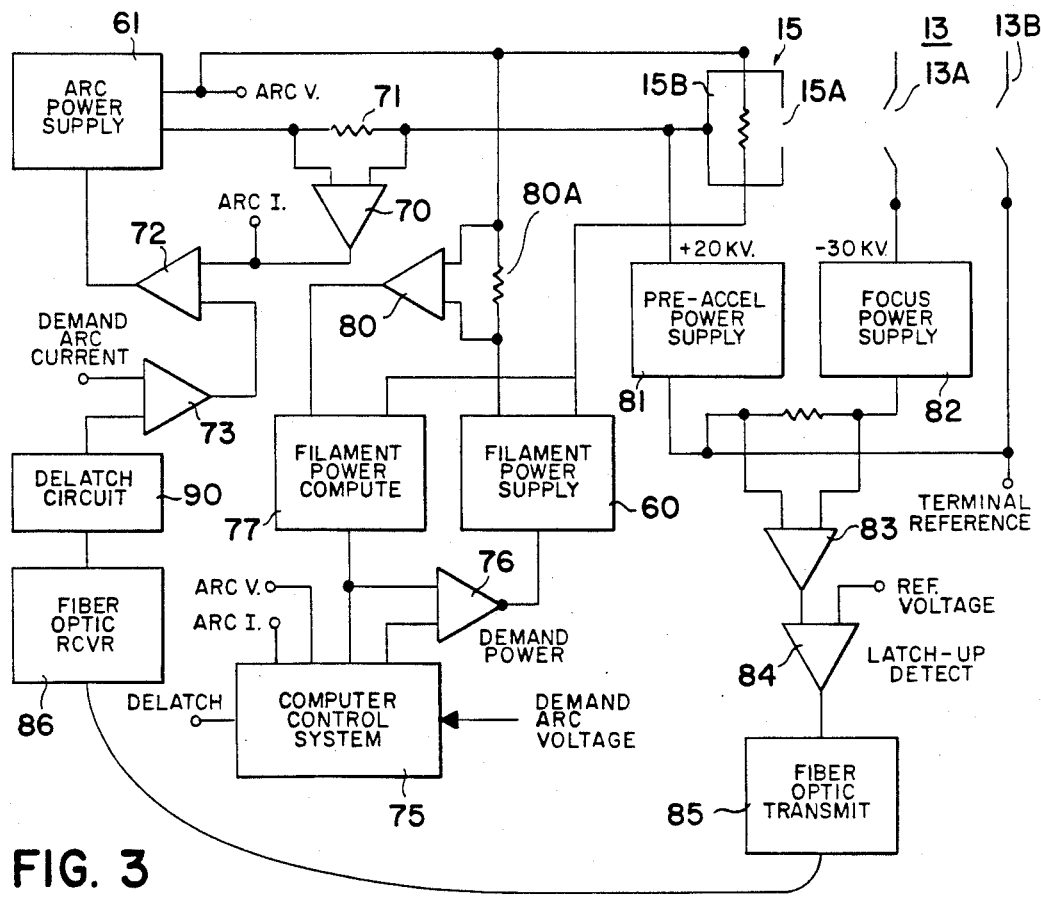
FIG. 3 is a schematic diagram of a system for ion source control in accordance with this invention.

FIG. 3 illustrates in a schematic manner the source control system and method in accordance with this invention which basically involves maintaining substantially constant arc current utilizing a fast servo control loop which alters the arc voltage applied between filament-cathode and anode to produce virtually instantaneous response and control of arc current with a relatively slower servo control loop which detects the changes in arc voltage and controls the amount of filament power to bring the arc voltage back to an arc voltage demand value. This new control approach will be referred to as the constant arc current mode of operation. It is also known as the arc voltage control mode since the filament power control loop is based on arc voltage, not arc current.

As shown in FIG. 3, the preferred approach to implementation of this system and method is to utilize a hardware control loop for maintaining constant arc current and a software control loop running on a computer control system to implement the slow servo control loop of filament power which maintains arc voltage at a substantially constant value. FIG. 3 also illustrates schematically an anti-latchup system which integrates with the arc power supply control system operating in the constant arc current mode. This portion of the system provides an early detection of an impending beam latchup condition caused by sparking between the arc chamber and the extraction electrode and quickly delatches the beam by pulsing down arc voltage and arc current to quickly shrink the beam and then to quickly recover to normal operating conditions after the delatching function has been accomplished. The details of the operation of this aspect of the invention will be discussed below.

The arc voltage control mode of this invention utilizes an arc current detection circuit 70 to detect changes in arc current across a shunt resistor 71 and feeds this arc current signal to an arc current error circuit 72. Arc current error circuit 72 compares the actual arc current with the arc current demand value and outputs a power supply control signal to control the arc voltage output by the arc power supply 61. The output of the arc current error circuit 72 is summed with the output of delatch circuit 90 for overall control purposes. However except when delatch circuit 90 is active, the control of the arc power supply 61 is entirely performed by the arc current error circuit 72. It has been discovered that fast changes in arc impedance within the arc chamber 15 can readily be accommodated by changing the arc voltage in response to the arc current error signal so that arc current can be maintained at a very stable value and very stable arc conditions will usually be achieved within the arc chamber.

It is necessary however to also provide for servo control of the arc voltage to maintain it substantially constant to avoid other instability conditions within the arc chamber which might occur due to changes in arc voltage. This is especially true under low arc current conditions and also at times when the filament 15B is nearing the end of its useful life. Control of the arc voltage to maintain it substantially constant is provided by a slow control loop implemented in a computer control system 75 which detects changes in arc voltage and executes a control loop program which alters the power demand signal to the filament power supply circuit to cause the power supplied to the filament to change in a direction which will inherently bring the arc voltage back to the demand value.

Control of filament power supply 60 is done through a power error circuit 76 which receives the power demand signal from the computer control system 75 and the actual power value from a power compute circuit 77. Power compute circuit 77 computes actual filament power from filament voltage on lead 78 and filament current on lead 79 as calculated by a filament current circuit 80.

The details of the control algorithm implemented in the computer control system are disclosed in software flowcharts included in the drawings and will be described in detail below. However, the basic principle of the control scheme involves comparing the actual arc voltage with the arc voltage demand and to use these inputs together with other inputs from the electronic control circuits to generate a new power demand signal which will change the filament power in a direction which will tend to raise or lower arc current so that, interactively, the arc current error circuit 72 will detect this gradual change in arc current and alter the arc voltage accordingly until it is back to the arc voltage demand level.

As will be discussed in more detail below, the arc voltage control mode of this invention, functioning under the control of computer control system 75, also provides for automated computer controlled startup of the ion source in a soft start routine which brings the source up to a relatively stable standard operating condition before switching over to arc current control mode for finally bringing the operation of the ion source to the arc current and arc voltage demand levels. The steps of this soft start control routine will be described in detail below.

FIG. 3 also illustrates schematically the general principles of a delatching system in accordance with this invention. The Aitken super high beam current technology utilizes a different beam extraction bias arrangement which incorporates a soft sparking feature. The arc chamber power supply 81 is a hard supply which produces up to twenty kilovolts of pre-analysis acceleration voltage to the ion chamber 15. Extraction electrode power supply 82 is a soft supply which provides up to a negative thirty kilovolts on the extraction electrode 13A. The decel electrode 13B is grounded. Because of the large negative voltage on the extraction electrode 13A, and the softness of that voltage in terms of the low current generating capability of the extractio electrode power supply 82, any sparking between the arc chamber 15 and the extraction electrode 13A tends to be quickly extinguished because the voltage on the extraction electrode drops rapidly. While this quickly extinguishes the spark and makes it a soft spark in terms of its total energy, the reduction in the voltage on the extraction electrode 13A can also cause the ion beam to lose focus control so that the edges of the beam will begin striking the extraction electrode. When this occurs the beam can latch up in this condition due to the inability to recover the focus voltage even when the spark has disappeared.

The delatching circuit of this invention employs a current level detect circuit 83 which detects the amount of current being drawn by the extraction electrode power supply and produces a corresponding output voltage. This output voltage is compared with a reference voltage in a latchup dietect circuit 84 which produces an output when the output of the current level detect circuit 83 exceeds the reference voltage value, indicating a latchup condition. This latchup signal is set by way of the fiber optic transmitter 85 to a fiber optic receiver 86 to signal a delatch circuit 90 to send an output to the arc power supply which quickly pulses down the arc voltage to momentarily turn down the ion beam and thereby eliminate the beam latched condition. The delatch circuit 90 sends a status signal to computer control system 75 to advise of the latched condition so that changes in arch current and voltage during delatching may be ignored.

Figure 1:
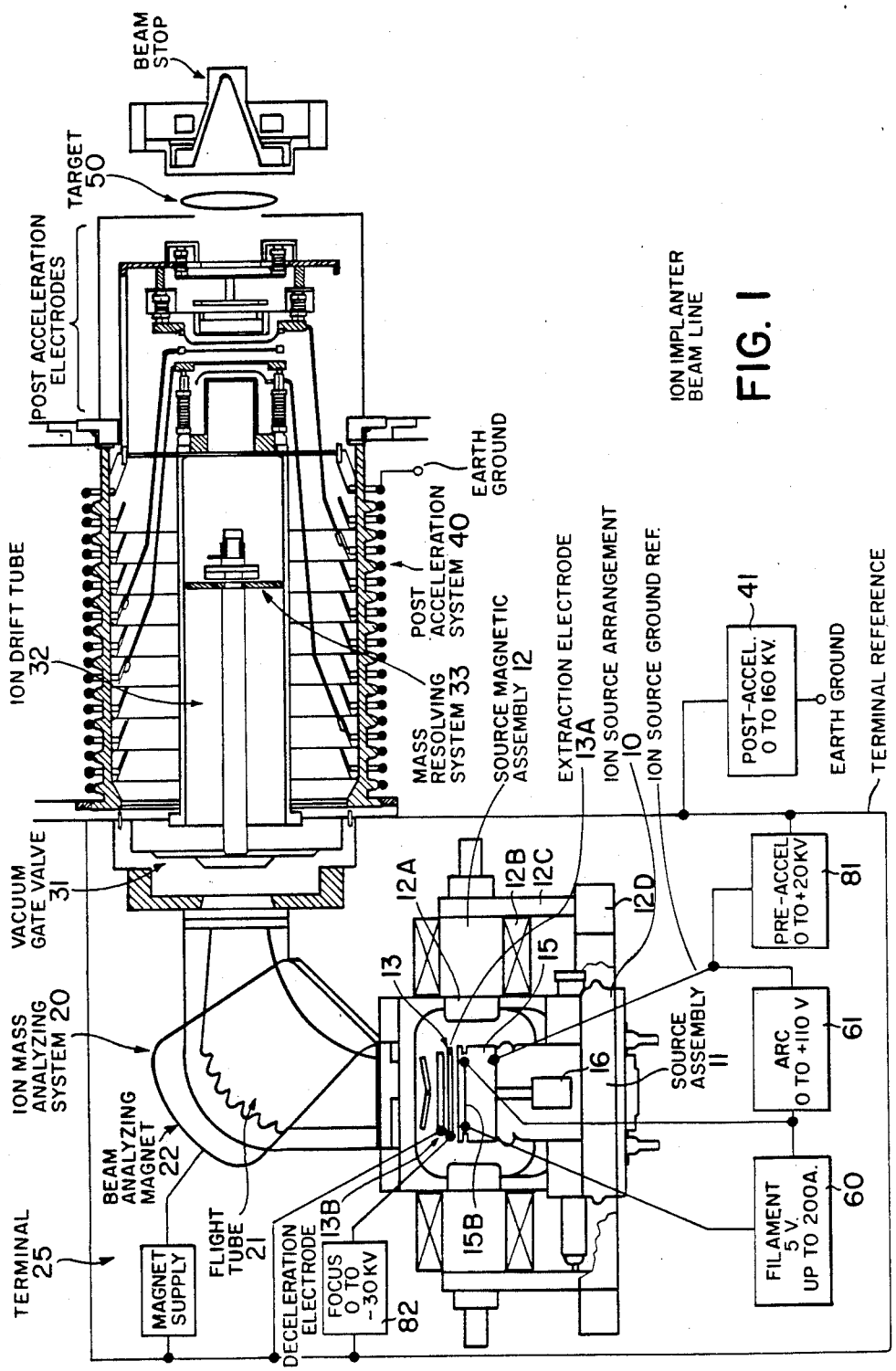
FIG. 1 is a partial section view of an ion implanter beam line which is the preferred system environment for the ion source control system and method of this invention.
Figure 2:
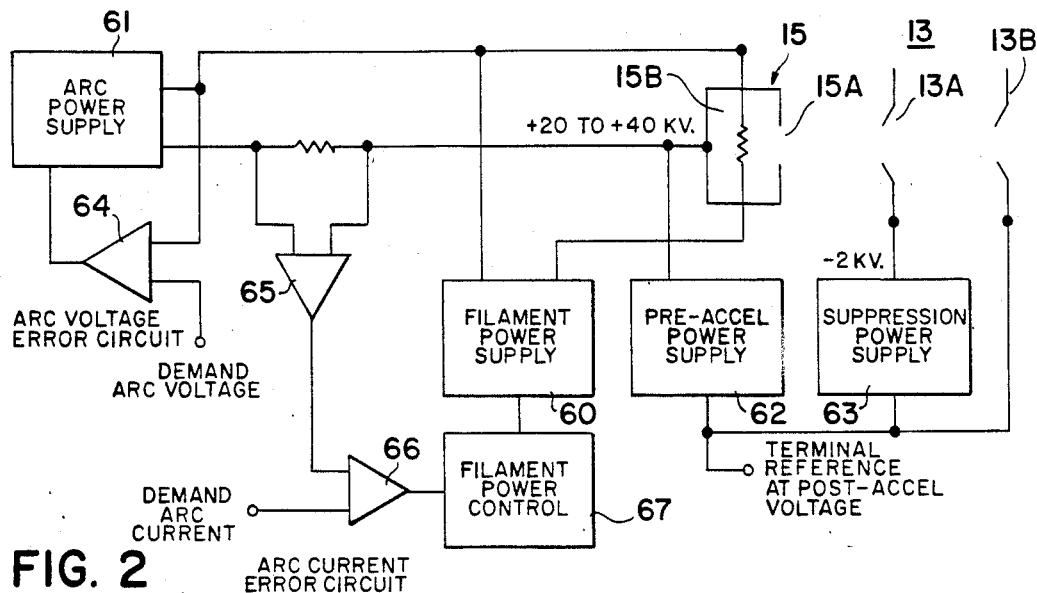
FIG. 2 is a schematic diagram of a prior art ion source control system and ion beam extraction system.
Figure 4:
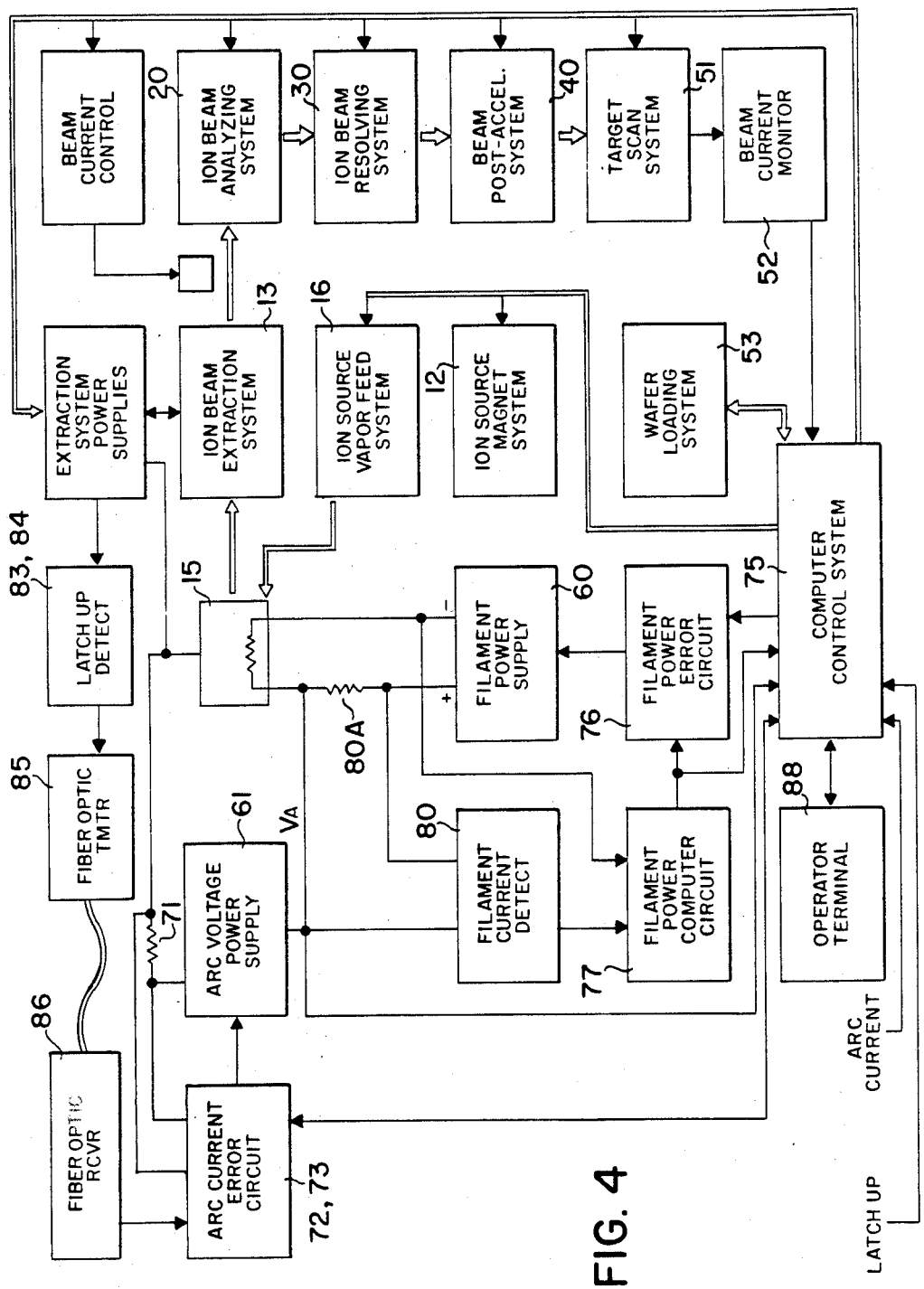
FIG. 4 is a block schematic diagram of an ion source control system in accordance with this invention integrated into a total ion implanter computer control system.

FIG. 4 together with FIG. 1 illustrates the manner in which the ion source control system and method of this invention may be integrated into an overall computer control arrangement for all of the subsystems of an ion implanter. It should be understood that the arc voltage control mode of this invention can be utilized in any ion implantation system which utilizes an ion source based on a heated filament and a filament-cathode to anode acceleratio potential which basically has the same type of operating characteristics as the Freeman ion source. Thus the ion source control system and method of this invention can be employed in ion implanters of the prior art as well as in an ion implanter based on the Aitken super high current beam technology.

The preferred environment for use of the ion source control system and method of this invention is an advanced ion implantation system which utilizes beam line technology from the above-identified copending Aitken application and further utilizes, as the wafer target scan system 51 and the wafer loading system 53, the technology disclosed in the above-identified copending patent applications. These technologies together with the system and method for ion source control in accordance with this invention facilitate bringing all operational aspects of an ion implanter under control of a central computer control system 75.

It is well known to those familiar with ion implanter systems that setup of the various components and subassemblies of the system to perform an implant is a complicated process since many control parameters are involved. Furthermore, many of these control parameters interact with each other so that the setting of one control parameter affects others. For example, the preanalysis acceleration voltage applied to the arc chamber by the extraction system power supplies controls the ion beam velocity extracted from the arc chamber 15. Since the ion beam analyzing system 20 is a mass or momentum analyzer, the current supply to the electromagnets of the beam analyzing system must be controlled in terms of the ion energy entering the beam analyzing system so that ions of the desired chemical species are passed through the resolving system 30 into the post acceleration system.

Control of the overall ion source involves control of the ion source gas feed system 16 (which may include a direct gas feed and ovens for vaporizing solid sources) and the ion source magnet system 12 as well as control of the electrical operating parameters of the filament-cathode and anode within the arc chamber 15. Since control over generation of the ions in the ion source lies at the very heart of the implanter system, achievement of effective computer control of the ion source itself is the foundation on which full automation of the entire implanter can be built. It has further been discovered that the ion source control system and method of this invention permits advanced implanter features such as automatic source tune-up under computer control to be realized. Using this inventio, small beam currents can be controlled using small arcs rather than generating large currents and using vanes to reduce beam current to small values.

The implementation of computer control of components and subassemblies which are at high voltage potential can be achieved utilizing fiber optic transmission to local data acquisition units to thereby provide high voltage isolation between these sections of the system.

Figure 5:
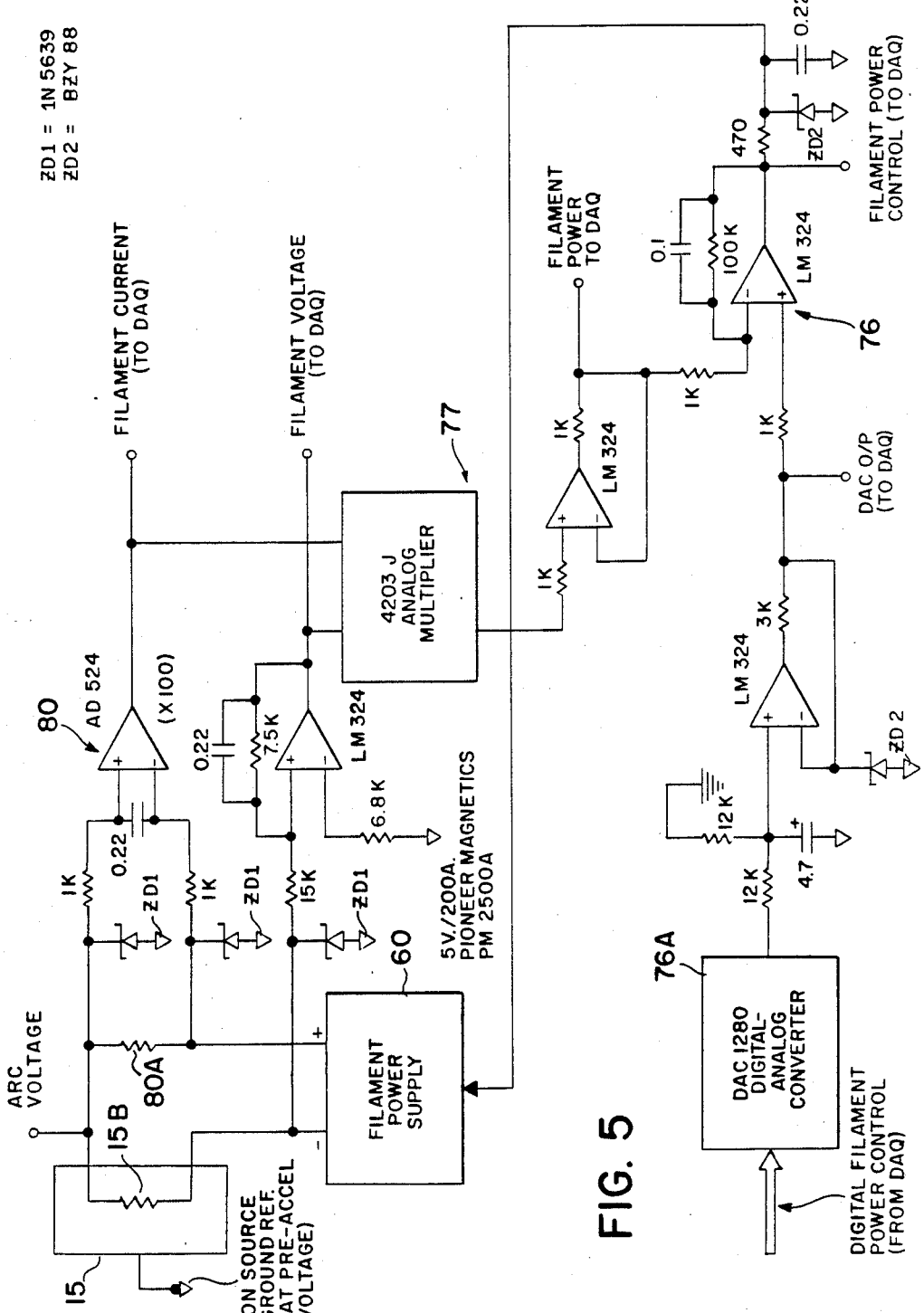
FIGS. 5 and 6 are electrical circuit schematic diagrams of arc voltage power supply control circuits and filament power supply control circuits incorporating features of this invention.
Figure 6:
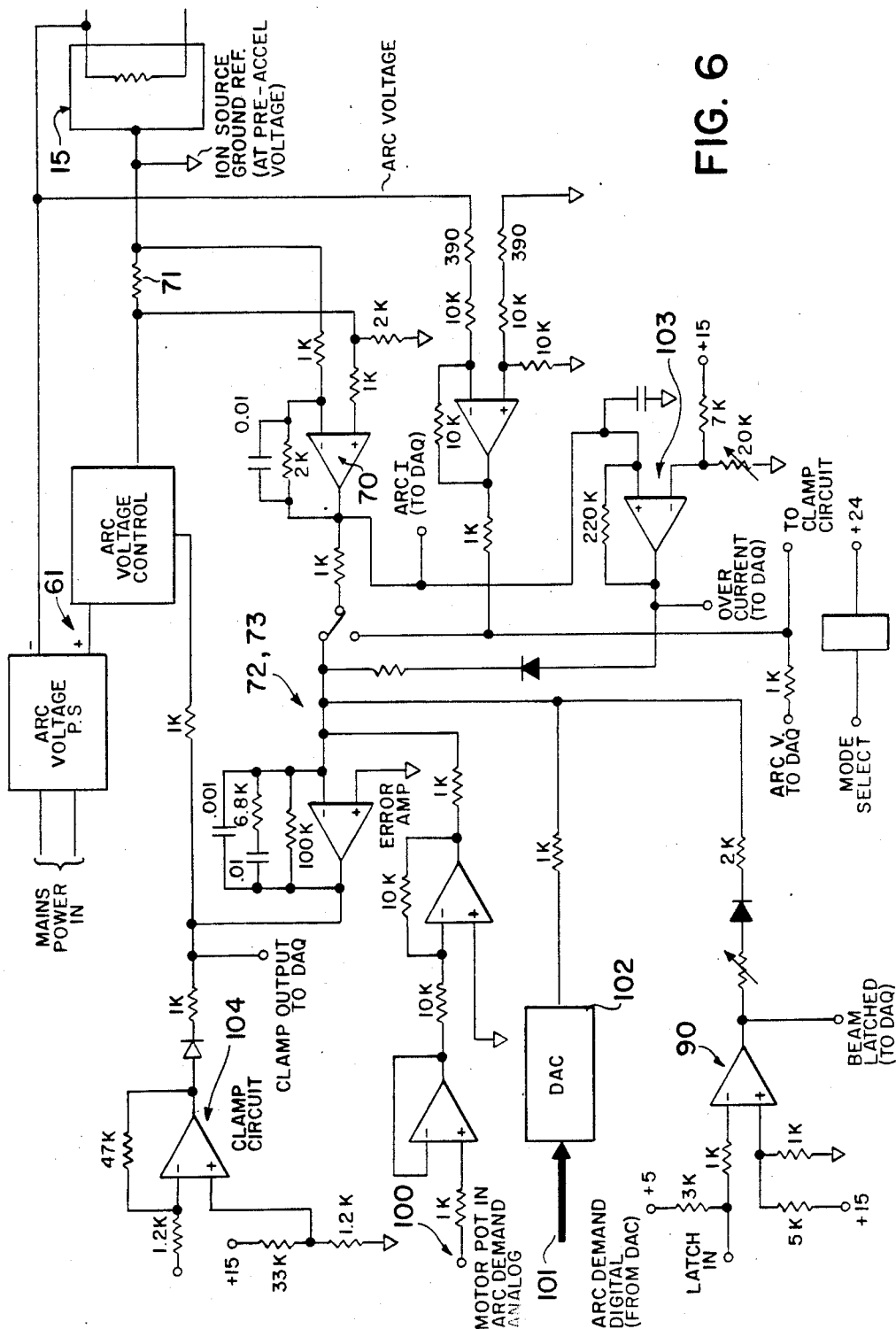

FIGS. 5 and 6 are partial circuit schematics which illustrate in more detail the circuit implementation of the electronic hardware portion of this invention. As shown in FIG. 5, the filament power control signal sent by the computer control system 75 to the filament power error circuit 76 is transmitted as a multibit digital control signal to the data acquisition unit associated with teh filament power control system and a digital to analog converter 76A converts the digital signal to an analog signal for input to the filament power error circuit. It will also be seen in FIG. 5 that various analog signal values of filament current, filament voltage, filament power, filament power control and digital to analog converter output are fed back to the data acquisition unit, typically through appropriate signal coupling networks, so that the central computer control system 75 can monitor the control signal parameters and operating parameters for purposes of status checking and error analysis.

FIG. 6 illustrates in more detail the arc power supply and control circuits associated therewith. The version shown in FIG. 6 includes a mode realy for controlling whether the arc voltage or arc current control mode is executed. It has been determined that the arc voltage control mode (i.e., arc voltage control of filament power with constant arc current) is superior over all ranges of arc conditions and thus the mode switch need not be provided.

As shown in FIG. 6, the arc demand analog signal is input on a terminal 100 as the output of a motor potentiometer circuit which is set under computer control. Since this arc demand signal is typically set once and does not require fast alteration, motor potentiometer control is satisfactory. This contrasts with the rapid digital control signal communication of a new power control signal from the computer into the filament power supply control circuit shown in FIG. 5. However, under certain circumstances it may be desireable to also be able to rapidly change the arc demand signal. Consequently, a separate provisio is made for communicating an arc demand digital signal component via digital input lines 101 to a digital to analog converter 102 whose output is summed with the motor pot analog demand signal at the input to the overall error circuit 72, 73. It will be appreciated that several different circuit approaches to the error amplifier can be implemented. The analog input signal summing arrnagemnet shown in FIG. 6 simplifies the overall error circuitry in view of the number of different input analog signals to be utilized in the overall final arc voltage control signal. The delatch circuit 90 receives a latch in signal and couples that signal at an appropriate analog level to the summing input of the error amplifier circuit to temporarily override any other input control voltages to perform the beam delaatching function. A hardware overcurrent protect circuit 103 is also included in the hardware control system. This overcurrent circuit provides a hardware clamp on arc current so that dangerously high arc currents cannot be called for.

The manner in which the circuitry of FIGS. 5 and 6 operates under control of the central computer control system 75 as shown in FIG. 4 will be apparent from the description of the software control routines given below.

Figure 7:
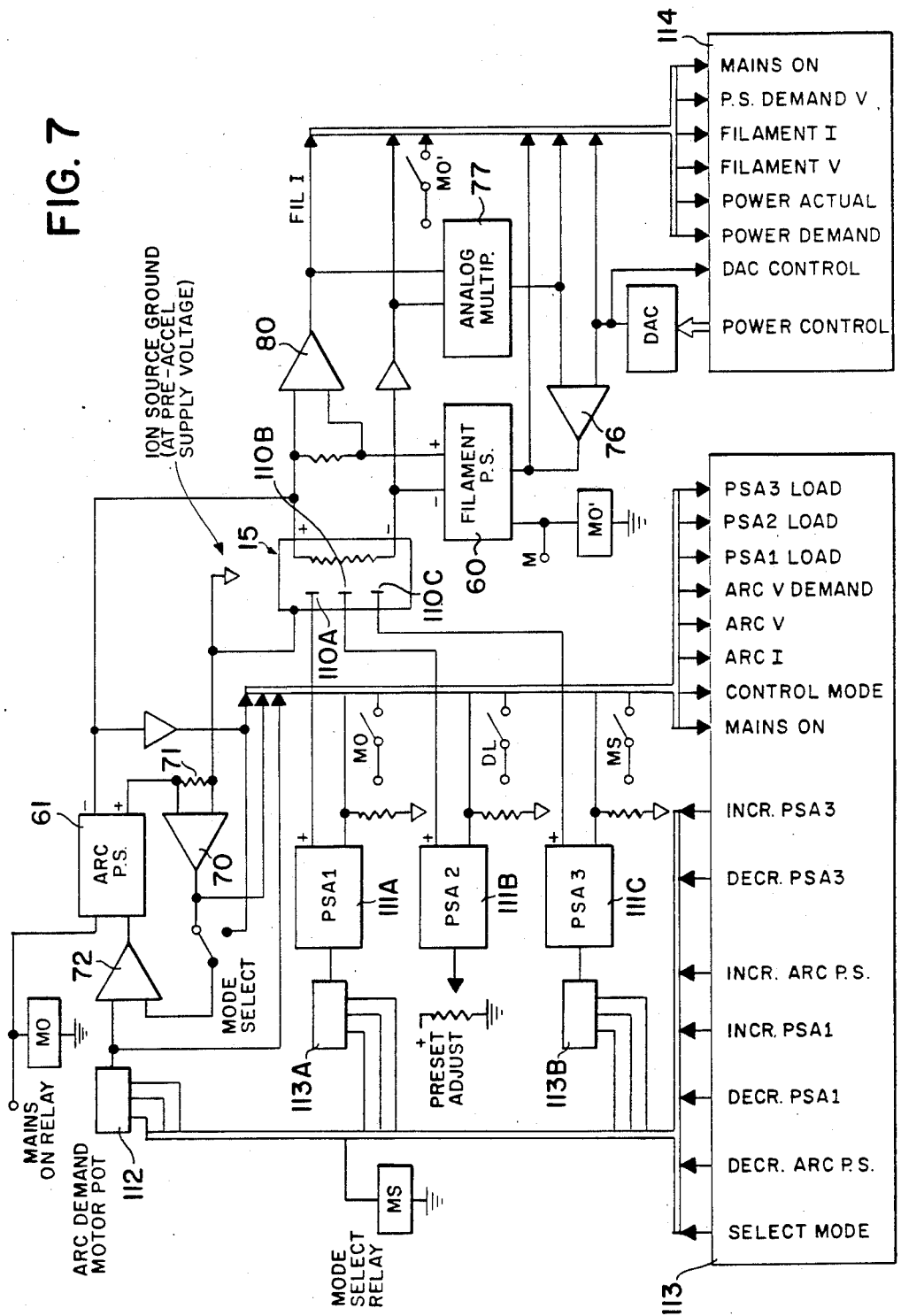
FIG. 7 is a block schematic diagram illustrating the ion source control system of this invention and communication of control and operating parameters to and from a computer system.

FIG. 7 illustrates in somewhat greater detail the input and output signals which are communicated via data acquisition units to the filament control system and the arc power supply control system. In particular, FIG. 7 illustrates that the ion source control system of this invention is preferably implemented in an ion source of the type disclosed in the above-referenced Aitken patent application which utilizes a split anode arrangement with each of the separate anode sectios 110A, 110B and 110C being coupled to separately programmable power supplies 111A, 111B and 111C for purposes of controllably modifying the plasma distribution in the ion source chamber and to compensate for field modification effects produced by the voltage applied across the filament.

Motor pot 112 is controlled via the DAQ system 113 which may involve one or data acquisition modules and separate motor pots 113A, 113B and 113C are operated to control the individual anode section power supplies 111A, 111B and 111C. A separate data acquisition module 114 is used to communicate with the filament power supply control board and has basically the input and output signals indicated.

Software Control Routines

Figure 8:
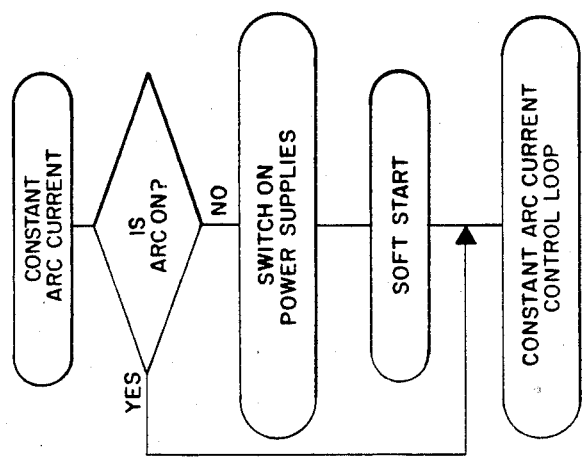
FIG. 8 is a diagram of the main software routines utilized in an ion source control system in accordance with this invention.

FIG. 8 illustrates the basic software routines involved in a constant arc current mode of controlling the Freeman type ion source in accordance with this invention. Since the constant arc current routine can be entered when the arc in the arc chamber is already on, the first test performed in to determine whether the arc is on or not. If the arc is on, the system directly enters the constant arc current control loop routine. If the arc is not on, the first routine performed is one to switch on the arc voltage power supply and the filament power supply. After this switch-on routine has been performed a soft start routine is performed to initiate an arc in the arc chamber in a well-controlled manner. If the soft start routine is successful, the constant arc current control loop is entered.

The routine to switch on the power supplies is relatively simple and need not be discussed in any detail here. Basically the routine starts by making sure the Freon coolant is turned on to the arc chamber and the dummy load resistor relay at the output of the arc power supply is off. A one amp current demand is set into a data structure and then the arc current motor pot is adjusted to this stored demand value. Thereafter, the mains power is switched on to the arc power supply, a timer is set and a control loop entered to check whether the mains has actually turned on prior to timing out of the timer.

A similar routine is used to turn on the filament power supply. Filament power demand is set at a minimum value, for example 120 watts, and then the power mains input to the filament power supply is turned on. A similar timer and checking loop is used to determine whether the mains to the filament power supply turns on within a predetermined time. Thereafter the system checks to determine that the filament supply is actually on.

Under these operating conditions, it is not expected that any arc will be struck so there will be no arc current. Since there is no arc current actually flowing but arc current demand has been set at one amp, the error circuit voltage to go up to its maximum value of about 140 volts. At this voltage there will still be no arc struck because the filament power is not sufficient to initiate the arc.

Figure 9:
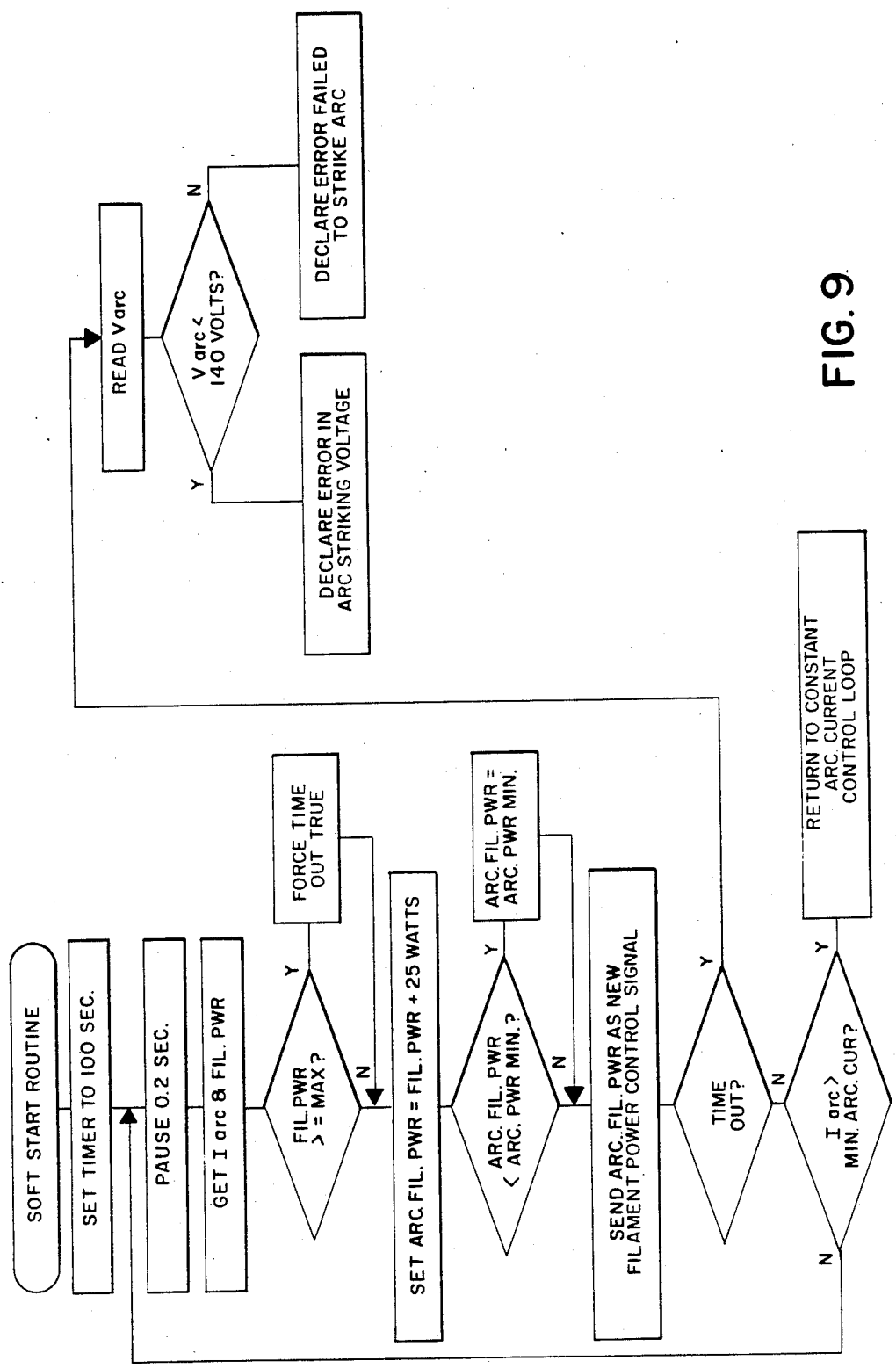
FIG. 9 is a software flow diagram for a soft start software routine in accordance with this invention.

Assuming the pwoer supplies have been successfully turned on, the software enters the slow start routine shown in FIG. 9. The basic function of the slow start routine is to slowly ramp up the filament power in small increments until an arc is struck and minimum arc current is flowing. This result must be achieved before a timer times out and before filament power is ramped up to the maximum permitted filament power.

The actual steps in teh slow start routine will now be described with reference to FIG. 9. The first step is to set a timer to 100 seconds as the maximum time permitted for successful striking of an arc. The routine pauses for 0.2 seconds and then gets the values of the arc current and the filament power via the DAQ communication system as previously discussed. Next a test is performed to determine whether the filament power is greater than or equal to the m;aximum permitted filament power. If it is, the timeout value is forced TRUE so that the routine will later exit and not loop around. The next step is to set the arc filament power (ARC.FIL.PWR) value, i.e. the value to be demanded for arc filament power to be equal to the actual filament power plus an incremental 25 wats. The 25 watt increment is a convenient value which has proven to be practicable but other incremental values in about the same range could be utilized.

Figure 10:
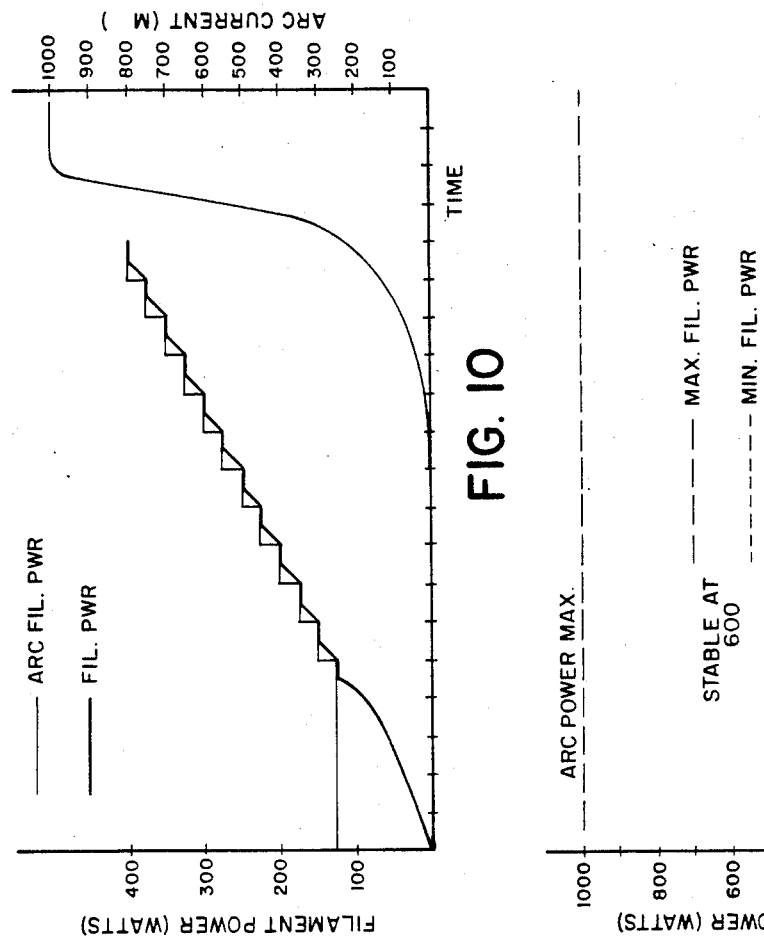
FIG. 10 is a diagram useful in illustrating the operation of the soft start routine of FIG. 9.

The system next determines whether this new arc filament power demand value is less than the arc power minimum value (e.g., 120 watts) already set into the filament control system during the supplies turn on routine. If it is, the arc power minimum value is maintained unchanged. Referring to FIG. 10, it can be seen that the arc filament power signal remains at the 120 wall value initially set unitl a new value overrides it. The ARC.FIL.PWR demand signal is sent via the DAQ to the filament power control circuit as the new filament power control signal. The system then checks to see whether a timeout has occurred. If the timeout has occurred, the system then goes off to a branch which determines what type of error occurred in striking the arc. This will be discussed below.

If timeout hasn't occurred, the system then tests to determine whether the value of arc current is greater than the minimum arc current value which has been established by experience to be a value which signals that an arc has been successfully struck. This value may, for example, be 100 mA as shown in The diagram of FIG. 10. If this test returns a negative, as it will be during the first few loops through the slow start routine, execution of the routine branches back to the pause step and re-executes. Under normal circumstances, after some number of loops through the main circumstances, after some number of loops through the main routine, an arc will be struck and the arc current will rise above the minimum arc current value and software control will be returned to enter the constant arc current control loop.

If a timeout has occurred, the routine executes the step of reading the arc voltage and then testing to see whether it is less than maximum arc voltage of 140 volts. If the arc voltage is less than the maximum 140 volts, the error declared is in the arc striking voltage itself. If the arc voltage is at the maximum of 140 volts, the error delcared is that the arc simply failed to strike. With one or the other of these machine errors delared, the user will be signaled that some problem has occurred and an attempt to locate the problem can thereafter be made.

Figure 11:
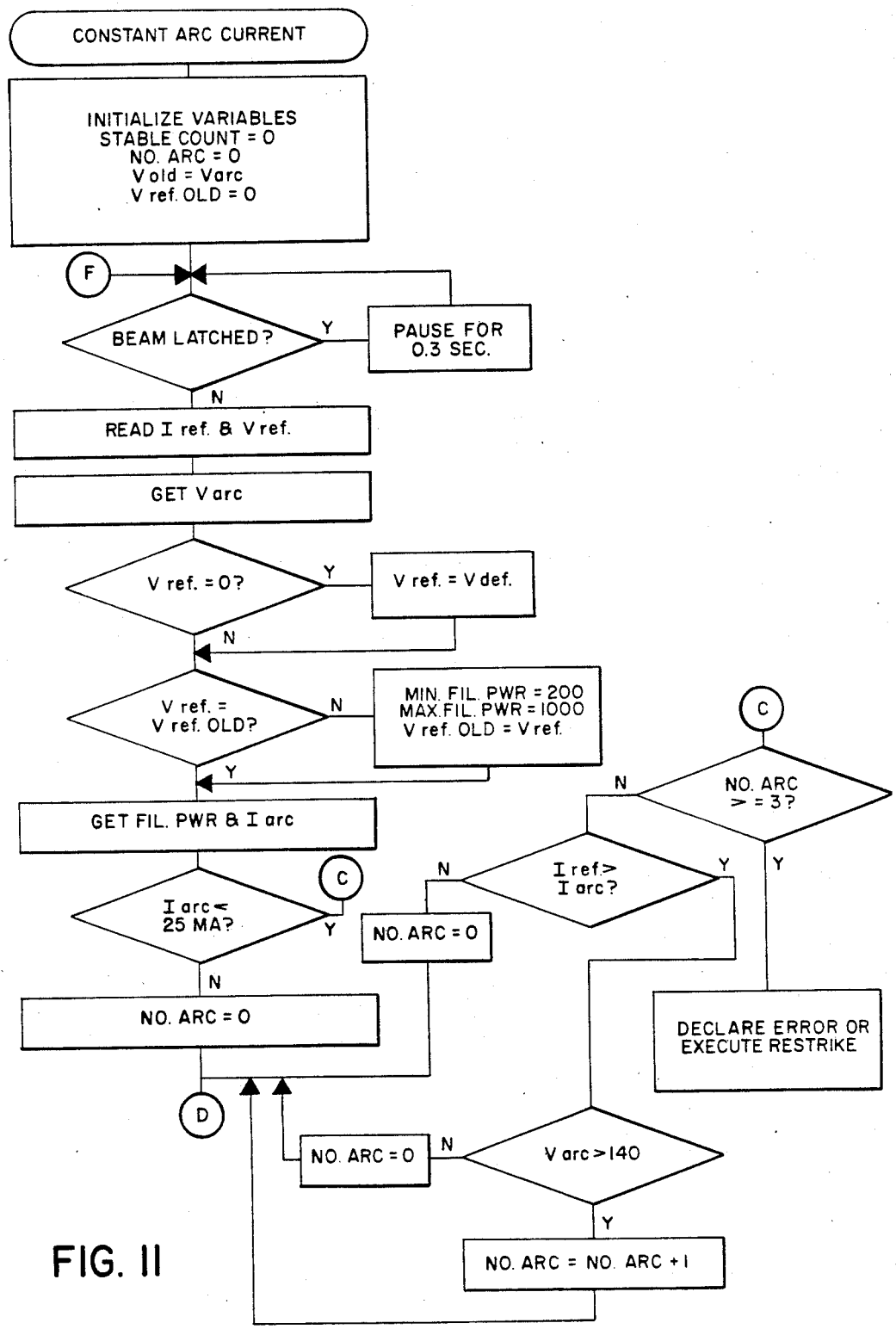
FIGS. 11-13 are software flow diagrams of a constant arc current control loop software routine in accordance with this invention.
Figure 12:
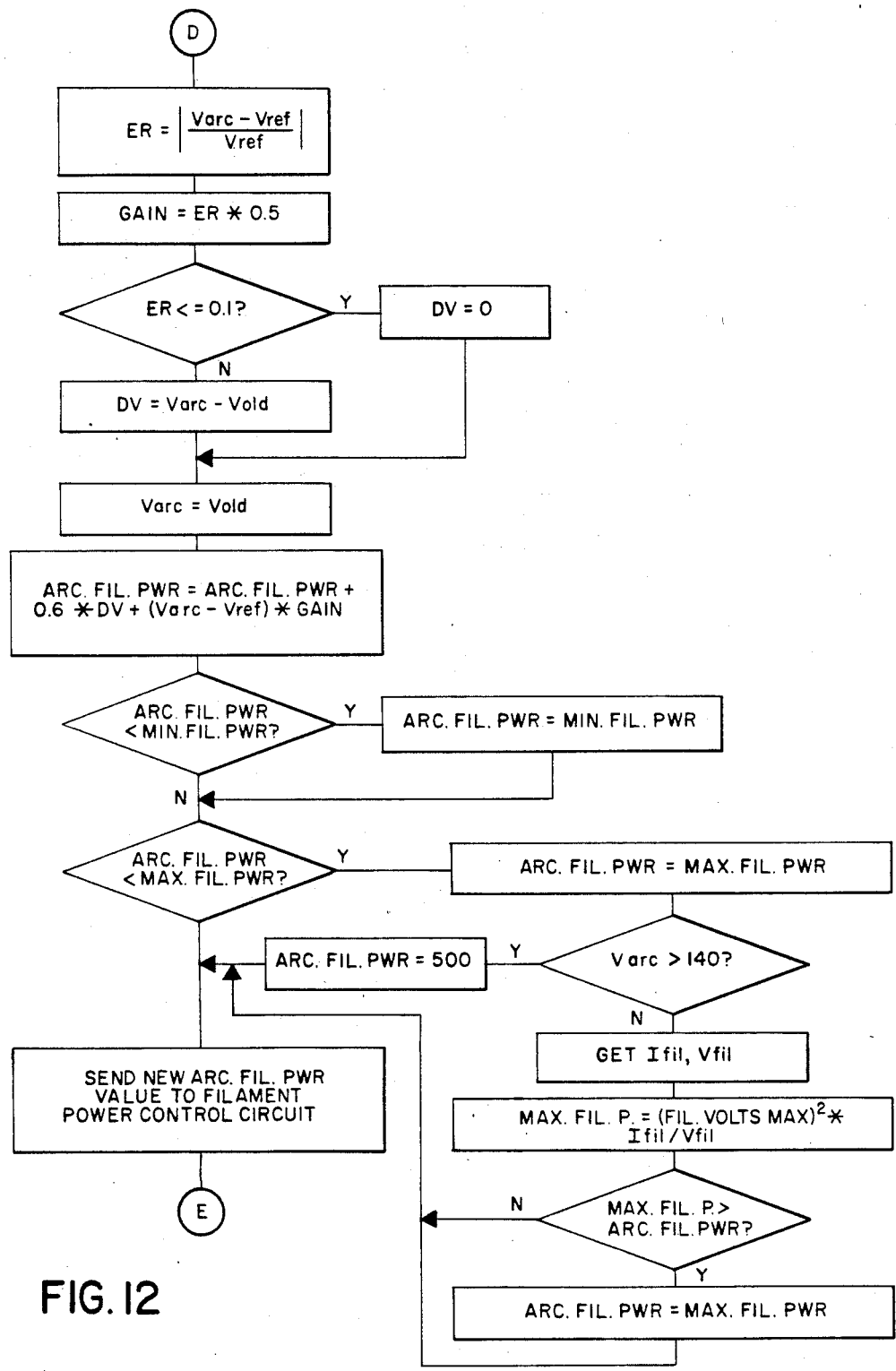
Figure 13:
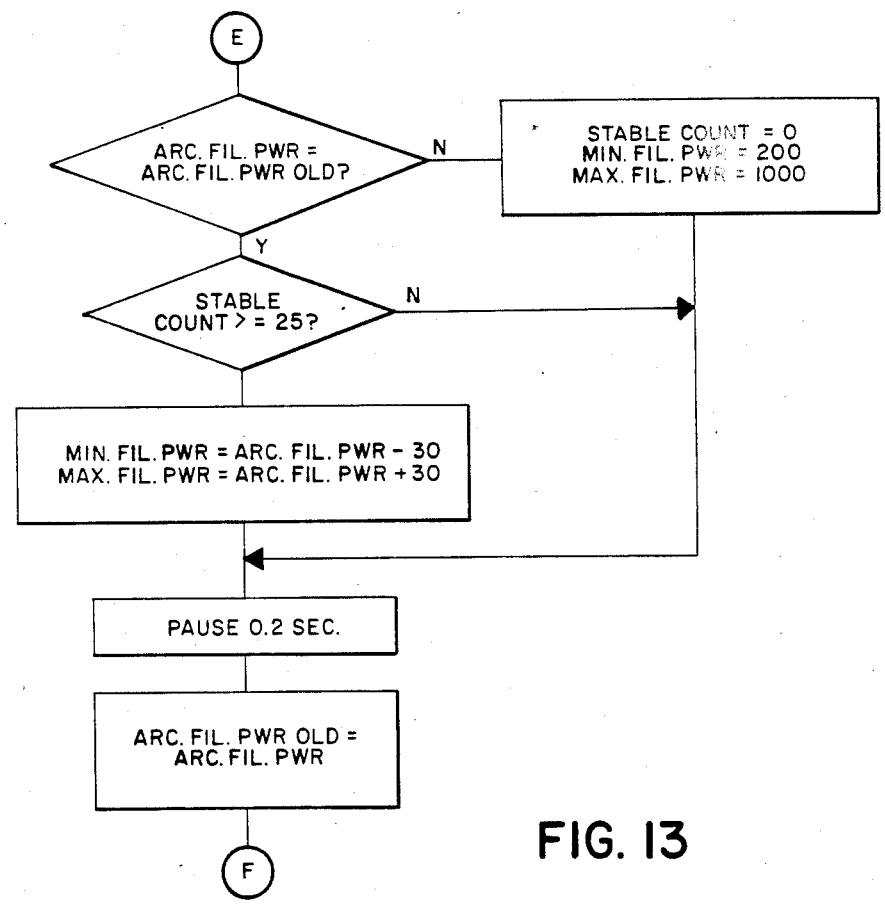

Assuming that the slow start routine has successfully started an arc in the arc chamber, the constant arc current control loop takes over to bring both the arc voltage and arc current to the user-defined or machine-defined values and thereafter to maintain the arc voltage at a substantially constant value utilizing a slow software-based servo loop which basically looks to detect a change in the arc voltage and to correspondingly change the arc filamaent power to bring the arc voltage back to the demand value. The constant arc current control loop routine is illustrated in FIGS. 11–13 which will be described in conjunction with the graph shown in FIG. 14. The constant arc current routine begins by initializing certain variables utilized in the routine. The STABLE COUNT variable is set to zero as are the NO.ARC and Vref.OLD variables. The valaue of the Vold variable is set to the current arc voltage value:Varc read fromthe circuitry.

After the variables haavea been initialized, the routine first tests to see whether the ion beam is in a latched condition. It does this by looking at a data structure flag which is written each time the beam latches. If the beam is in a latched condition, the routine branches off for three-tenths of a second and then checks again to see if the beam is still latched.

If the beam-latched test is negative the system reads in the demanded arc current Iref and the demanded arc voltage Vref. These values will be stored in internal data structures within the computer. The system then gets the value of the arc voltage Varc via the appropriate DAQ.

The next step performed is to determine whether the demand arc voltage Vref has been set to a zero value, which is not realistic. If such a value has been set the Vref value is reset to a default value Vdef and execution continues. The next step is to test whether the value of Vref is equal to the value of Vref.OLD. It will be remembered that Vref.OLD was initialized to zero as the first step in the program, so the first time through the loop, this test will be negative. Thiscauses the program to set MIN.FIL.PWR equal to 200 watts, MAX.FIL.PWR equal to 1000 watts, and to set Vref.OLD equal to Vref. In subsequent loops through the routine Vref will equal Vref.OLD unless a new Vref value has been set into the data structure either by the user or some automatic source tuning routine.

The system now goes out and gets the values of FIL.PWR and arc current Iarc. Next the Iarc value is tested to see if it's less than 25 mA. This 25 mA value is one that has been preselected as a practicable value to use as a test whether the arc may be out under some circumstances under which not a final test since there are circumstances under which the arc current demand may be set at less than 25 mA. However, in most operating situations higher arc current will be demanded and the arc will probably be out if the arc current value is below 25 mA. If this test is positive the system branches off to special routines to deal with that situation. These routines will be described below.

Temporarily it will be assumed that this test returns a negative and the NO.ARC variable is then set to zero. The system now enters the actual software-based servo loop which will determine first whether there is an error in arc voltage and, if there is an error, an appropriate change in filament power will be signaled in the direction which will tend to correct the error.

The first step in this routine is to calculate a fractional error ER as the absolute value of the difference between Varc and Vref divided by Vref. Next the integral gain constant is set equal to the fractional error ER times a preset gain constant value of 0.5 which has been empirically determined ot give good results. The system then determines whether the fractional error is so small that it can be ignored for purposes of a differential gain factor in the final change in ARC.FIL.PWR. The system tests whether than ER is less than or equal to 0.1. If it is, the differential variable DV is set to zero. Otherwise, the differential variable DV is set to a value equal to Varc minus Vold. Since Vold is next set to be equal to Varc it will be seen that the differential variable has a value equal to the amount the arc voltage has acutally changed since the last time the loop was executed. Since the loop execution interval is relatively constant, DV is a measure of how fast the arc voltage is changing. The program now calculates a new ARC.FIL.PWR demand value by incrementing the old ARC.FIL.PWR demand value by both a differential term and an integral term, both of which may have zero value if the arc is stable. The differential term involves multiplying a derivative gain constant value (0.6 in this case) by the change in arc voltage produced by the last change in filament power. The integral gain factor has a value based on the distance that the arc voltage is away from the actual demanded arc voltage. The differential and integral gain factors will have different signs.

The system then goes into a checking routine to see whether it makes sense to use the new ARC.FIL.PWR value calcualted. It first tests whether the new ARC.FIL.PWR value is less than the MIN.FIL.PWR value. If that test is affirmative, ARC.FIL.PWR is set to the minimum value rather than use the calculated value. This precludes setting a new ARC.FIL.PWR value which could cause the arc to go out. Next a test is performed to determine whether the new ARC.FIL.PWR value is greater than the MAX.FIL.PWR value. If this test is negative, the new ARC.FIL.PWR value is sent via the DAQ to the filament power control circuit to move the filament power in a direction which will tend to correct the error in arc voltage.

If the ARC.FIL.PWR value is greater than the MAX.FIL.PWR value, the program sets the ARC.FIL.PWR value equal to the MAX.FIL.PWR value and then tests to see whether the Varc value is greater than the minimum arc striking voltage of 140. If this test is satisfied, the arc is in a highly unstable condition. Therefore, to try to recover a stable condition, or at least to prevent burnout of this filament, the arc filament power is set at a maximum of 500 watts. If the above-stated condition is not satisfied, the system calcuates the maximum power the filament is capable of taking MAX.FIL.P using the resistance value Ifil/Vfil multiplies by the square of the value of the maximum voltage deliverable by the filament power supply. The system then tests to see of the value of MAX.FIL.P is greater than the ARC.FIL.PWR (which was set to MAX.FIL.PWR). If it is greater, then the ARC.FIL.PWR is set to the MAX.FIL.P value. If it is not greater, the ARC.FIL.PWR value remains at MAX.-FIL.PWR. At this time the ARC.FIL.PWR value is sent to the filament power control circuit as the new power demand signal.

Figure 14:
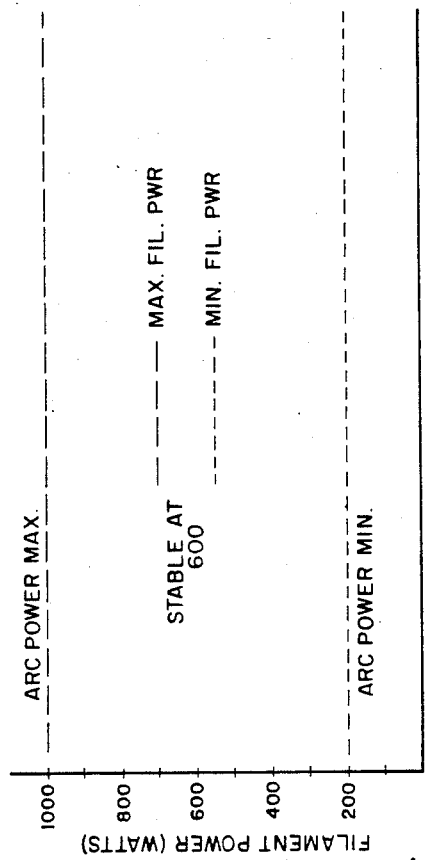
FIG. 14 is a chart useful in explaining a portion of the constant arc current routine shown in FIGS. 11-13.

At this point the program performs a check to determine whether the arc is and has been in a very stable condition and, if it has, it narrows the MAX.FIL.PWR-MIN.FIL.PWR band to plus and minus 30 watts offset from the current ARC.FIL.PWR value as shown in FIG. 14. Specifically the program first tests whether the ARC.FIL.PWR value is equal to the ARC.FIL.PWR.OLD value. If this test return a NO, the program sets the STABLE COUNT variable to zero, sets the MIN.-FIL.PWR to 200 watts and the MAX.FIL.PWR to 1000 watts. If the test returns a YES, the system then tests whether the STABLE COUNT value is greater than or equal to the stable threshold parameter which has been selected to be 25. If the STABLE COUNT is greater than or equal to 25, MIN.FIL.PWR is set equal to ARC.FIL.PWR −30 and MAX.FIL.PWR is set to ARC.FIL.PWR +30. These values will prclude large changes in the next ARC.FIL.PWR calculatio during the next time through the loop. This is based on experience that, if the arc has been stable for some time, a condition which makes it look unstable may be a temporary phenomenon such as a small flake falling into the source and temporarily shorting out the arc or a beam latching condition. At this point the program pauses for 0.2 seconds to allow whatever change in arc filaament power demand has been made to take effect. It then sets the ARC.FIL.PWR.OLD value to the current ARC.FIL.PWR value to use the next time around the loop and then the program loops back to the beginning to re-execute.

Now going back to FIG. 11 where the test was performed to determine whether the value of Iarc is less then 25 mA, if this test returns a YES value, the system first tests to see whether the NO.ARC variable is greater than or equal to 3. In other words, the system is given three times through the loop to recover itself from what appears to be a no arc condition. If that test returns a negative, the next step is to test whether Iref is greater than Iarc. If Iref is not greater than Iarc, this means that Iarc has been set at a value less than 25 mA and the arc is not out. Consequently the value of NO.ARC is set to zero and the programs continues its execution at point D. If the test for Iref greater than Iarc returns a YES, the system tests to see if the Varc value is greater than or equal to the minimum arc striking voltage of 140. If that test returns a NO, it means the arc ahs not gone out and NO.ARC is set to zero. If that test returns a YES, the NO.ARC value is incremented by 1.

It will be seen that, if this test for the arc having gone out is positive three times through the loop, then the NO.ARC greater than or equal to 3 tests will be satisfied and the program will treat the system as having a NO.ARC condition. Depending on various optional settings either an error will be declared or an arc re-strike routine will be executed.

It should be appparent from the above description of the hardware and software features of this invention and their operation, that the ion source control system and method of this invention provides an effective approach to controlling the arc conditions within a Freeman type ion source (or other similar type ion source). It will be apparent to those skilled in the electronic circuit and software art that various changes could be made in the systemand method as disclosed without departing from the basic concepts on which this invention rests. For exmaple, it would be possible to have the computer contorl system calculate actual filament power rather than computing it in an analog fashion in the circuitry. If has been determined that the overall efficiency and effectiveness of the system is enhanced using an analog compute of the actual filament power. Furthermore this reduces the amount of communication that is required to the filament power supply control board.

It will also be apparent to persons of skill in this art that the particular software control routines disclosed in the drawings and discussed above could be modified in numerous ways and yet achieve the same overall basic feedback control of ion source conditions.

The system and method of this invention has been verified to provide very good results in actual testing in prototype ion implanter systems utilizing the Aitken super high beam current technology. Stability of ion source operation has been achieved over arc current values ranging from 10 mA to 10 amps. The high arc current region of operation is especially important for the Aitken super high beam current technology since the ion source is being driven very hard under these conditions and is most subject to erratic behavior and difficult control operations under there high arc current conditions. Furthermore, these conditions require that high source magnetic fields be utilized for efficiency in creating the plasma within the arc chamber. This also tends to create instability in the operation of the ion source.

The ability to control low arc currents is also important since it facilitates running low beam currents without beam vane trim-out of a large fraction of the beam current.

Effective combined hardware/software control of the ion source operation under such high and low arc beam current conditions shows that the system and method in accordance with this invention achieves superior results and furthermore achieves results which would be unattainable with the prior art method of control.

Because of the effectiveness of the control hardware and software features of this invention, the overall ion implanter system functioning under computer control can utilize various other software algorithms for implementing such advanced features as automated source tuning for maximum beam current or to achieve other targeted beam parameters.

The main advantage of the system and method of this invention is that it will facilitate overall automated operation of an ion implanter to a degree that the clean room operators of the implanter will be able to select ion implant procedures from a menu of prearranged stored ion implant protocols, load the wafers into the system and set the system to running on automatic operation without further tending by technicians or operators. Accordingly, this invention contributes directly and materially to the achievement of fully automated io implanters which are needed in advanced semiconductor integrated circuit fabrication operations. It will be appreciated by those skilled in the art that numerous changes could be made in the specific system and method embodiments of this invention disclosed herein without departing from the scope of the invention as claimed in the following claims.

What is claimed is:

1. In a method for operating an ion source having a filament-cathode and an anode mounted within the ion source chamber, the steps of:
   supplying direct current voltage between said anode and said filament-cathode and providing a fast servo control loop for varying arc voltage on said filament-cathode in response to detected changes in arc current to modulatae said arc current to a substantially constant value;
   supplying direct current electrical power to said filament-cathode;
   monitoring the value of said arc voltage; and
   altering the magnitude of electrical power supplied to said filament-cathode in response to detected changes in said arc voltage to return said arc voltage to substantially a preset reference value.

2. The method of claim 1, wherein said monitoring step and said altering step are carried out at regular preset intervals; and said altering step includes the steps of:
   deriving an filament power error signal as a prearranged function which includes the difference in values between said monitored arc voltage and said preset reference value multiplied by a predefined integral gain value; and
   altering the magnitude of electrical power supplied to said filament-cathode by the value of said filament power error signal.

3. The method of claim 2, further comprising the step of storing the last value of monitored arc voltage, and wherein said prearranged function further includes a second added component of filament power error signal comprising the difference in values between the current value of monitored arc voltage and the stored last value of monitored arc voltage multiplied by a predefined derivative gain constant.

4. The method of claim 2, wherein said integral gain value is calculated to be a function of the absolute value of the fractional error between said monitored arc voltage value and said reference arc voltage value.

5. The method of claim 3, wherein said integral gain value is calculated to be a function of the absolute value of the fractional error between said monitored arc voltage value and said reference arc voltage value and said second added component of filament power error signal is ignored if said integral gain value is below a preset limit.

6. The method of claim 5, wherein said step of altering the magnitude of electrical power supplied to said filament-cathode is limited to altering said magnitude to be no more than a preset maximum filament power value or a preset minimum filament power value.

7. The method of claim 1, wherein said step of supplying power between said anode and said filament-cathode cmprises the steps of:
   monitoring the value of the arc current flowing between said anode and said filament-cathode;
   deriving an arc current error signal as a function of the difference between said monitored arc current value and a preset arc current demand signal; and
   altering the voltage supplied to said filament-cathode as a function of said arc current error signal until said monitored arc current is equal to said arc current demand signal.

8. The method of claim 7, wherein all said monitoring step and said altering step are carried out at regular preset intervals; and said altering step includes the steps of:
   deriving an filament power error signal as a prearranged function which includes the difference in values between said monitored arc voltage and said preset reference value multiplied by a predefined integral gain value; and
   altering the magnitude of electrical power supplied to said filament-cathode by the value of said filament power error signal.

9. In a method for starting and operating an ion source having a filament-cathode and an anode housed in an ion source chamber to reach and maintain a stable preset arc current value and a stable preset arc voltage value, the steps of:
   applying a direct current voltage across said filament-cathode and anode at a initial maximum Varc value in excess of said preset arc voltage value;
   applying direct current power to said filament-cathode at an initial value below a power level required to initiate an arc in said ion chamber;
   monitoring arc current in said chamber at regular preset intervals to determine whether arc current of a preset minimum value is present;
   applying at the end of each of said preset monitoring intervals an incrementally increased value of direct current power to said filament-cathode until an arc current of said preset minimum value is detected in said monitoring step and thereafter:
   monitoring continuously the value of arc current flowing between said anode and said filament-cathode;
   monitoring at preset intervals the value of arc voltage applied between said anode and said filament-cathode;
   deriving an arc current error signal as a function of the difference between said monitored arc current value and said preset arc current value;
   altering the voltage supplied to said filament-cathode as a function of said arc current error signal to bring said arc current to said preset arc current value and thereafter to maintain said arc current at said preset value;
   altering during each of said preset monitoring intervals the magnitude of electrical power supplied to said filament-cathode in accordance with a function which includes the difference between said monitored value of arc voltage and said preset value of arc voltage to bring said arc voltage value to said preset value and thereafter to maintain said arc voltage at substantially said preset value.

10. In an ion source system, in combination:
    an ion source having a chamber with a filament-cathode and an anode mounted within said chamber
    arc power supply means for supplying direct current electrical power between said anode and said filament-cathode, including means for maintaining substantially constant arc current flowing between said anode and said filament-cathode with accompanying variations in the arc voltage on said anode;
    filament power supply means for supplying a value of direct current electrical power across said filament-cathode in response to a filament power control signal;
    means for monitoring the value of said arc voltage on said anode;
    means for developing an filament power error signal as a predefined function of the difference between said arc voltage value and a reference arc voltage value;

and means for altering the magnitude of electrical power supplied to said filament-cathode as a function of said filament power error signal to return said arc voltage to said reference arc voltage value.

11. The system of claim 10, wherein said arc power supply means comprises:
an arc power supply for supplying a dc voltage between said filament-cathode and said anode and responsive to an input control signal to vary the arc voltage on said filament-cathode;
means coupled in circuit with said arc power supply and said filament-cathode and said anode for producing an arc current signal corresponding to the value of said arc current; and
error circuit means receiving said arc current signal and a preset arc current demand signal for supplying said input control signal to said arc power supply as a signal with a value proportional to the difference between said arc current signal and said arc current demand signal, said arc power supply thereby responding to said control signal to alter said arc voltage until said arc current signal is equal to said arc current demand signal.

12. The system of claim 10, wherein said altering means comprises:
means coupled in circuit with said filament power supply and said filament-cathode for producing a filament current signal corresponding to the value of current flowing through said filament-cathode;
means for deriving a filament voltage signal corresponding to the value of the voltage applied to said filament-cathode;
means receiving said filament current signal and said filament voltage signal for producing a filament power signal;
means responsive to said filament power error signal for developing a filament power demand signal; and
error circuit means receiving said filament power signal and said filament power demand signal for producing a control signal to said filament power supply with a magnitude proportional to the difference in values between said filament power signal and said filament power demand signal to thereby cause said filament power supply to alter the power applied to said filament until the values of said filament power signal and said filament power demand signal are equal.

13. In an ion source system, in combination:
an ion source having a chamber with a filament-cathode and an anode mounted within said chamber;
arc power supply means for supplying direct current power between said filament-cathode and said anode and being responsive to an input control signal to control the arc voltage applied to said filament-cathode;
arc current detect circuit means coupled to said filament-cathode and said arc power supply for producing an arc current signal having a value corresponding to the value of arc current flowing between said filament-cathode and said anode;
first error circuit means having an arc current demand input lead and being coupled to said arc current detect circuit means for supplying said input control signal to said arc power supply means as a signal value proportioal to the difference between said arc current signal and the signal value on said arc current demand lead to cause said arc power supply to alter said arc voltage until said arc current demand value and said arc current valaue are equal or said arc voltage is at a maximum value;
filament power supply means for supplying direct current electrical power across said filament-cathode and being responsive to an input control signal to control the amount of power applied to said filament;
filament power detect circuit means coupled to said filament-cathode for detecting the value of power being consumed in saif filament;
second error circuit means having a filament power demand input lead and being coupled to said filament power detect circuit means for supplying said input control signal to said filament power supply means as a signal value proportional to the difference between saif filament power value and the signal value on said filament power demand input lead to cause said filament power supply to alter said electrical power applied to said filament until said filament power value and said filament power demand value are equal;
a programmable computer system including input circuits communicating with said arc power supply and said filament power detect circuit means for inputting values of arc current and filament power, output circuits communicating with said first and second error circuits for outputting values of arc current demand and filament power demand thereto, and memory circuit means for storing values of arc current reference demand and arc voltage reference demand and other predefined variables, said computer circuit further including program means for sending an arc current demand signal value to said first error circuit to establish said arc current at said value and for executing a filament power setting control routine at preset time intervals, said routine including inputting the value of arc voltage, calculating the absolute value of the fractional error between the input arc voltage value and the stored arc voltage reference demand value, calculating a new filament power demand value as a prearranged function which includes a prearranged gain factor proportional to said absolute value of fractioned error times the difference between input arc voltage and stored arc voltage reference, and communicating said new filament power demand signal to said second error circuit.

14. The system of claim 13, wherein said prearranged gain factor is proportional to said calculated absolute value of fractional error and said prearranged function includes a derivative power correction term if said prearranged gain factor has a value greater than a preset amount and said derivative power term is proportional to the difference between the current value of arc current and a stored value of arc current from a prior execution of said routine.

15. The system of claim 14, wherein said routine further includes testing whether said new filament power demand value exceeds preset upper or lower limits on filament power demand and resetting said new filament power demand value to an appropriate one of said limits which would otherwise be exceeded.

16. The system of claim 14, wherein said routine further includes testing whether said new filament power demand value is equal to the new filament power demand value calculated during the last execution of said routine, incrementing a STABLE COUNT parameter if said values are equal, resetting said STABLE COUNT value to zero if said value are unequal, testing to determine whether the STABLE COUNT value exceeds a preset threshold which indicates stable arc conditions, and resetting the upper and lower limits on filament power demand to be a preset amount above and below the current arc filament power value if said STABLE COUNT threshold value is exceeded.

17. The system of claim 15, wherein said ion source includes an ion exit aperture and said system further comprises an extraction electrode mounted adjacent said ion exit aperture, a decel electrode mounted adjacent said extraction electrode, first biasing means for biasing said ion source to a first positive voltage relative to the bias on said decel electrode, second biasing means for biasing said extraction electrode to a negative voltage value substantially on the same order of magnitude as said positive voltage with limited current capacity to preclude hard sparking between said extraction electrode and said ion source, latching detect means coupled to said second biasing means for detecting a condition of substantial ion beam striking said extraction electrode which might cause latch up of the beam on said electrode; and circuit means coupled to said latching detect means and to said error circuit means to produce an output from said error circuit for a short time interval which lowers arc current to prevent or eliminate said beam latch up condition; said computer system further including an input circuit communicating with said latching detect means to input a latched condition flag to said computer; and said filament power setting routine further includes bypassing said new filament power demand signal calculation and output of a new filament power demand signal when said latched condition flag signals that a beam latched condition is being processed by the hardware circuitry.

18. In a method for operating an ion source having a filament-cathode and an anode mounted within the ion source chamber, and extracting an ion beam therefrom, the steps of:
 disposing a focus electrode adjacent said ion source; disposing a deceleration electrode adjacent said extraction electrode; supplying direct current electrical potential to said ion source at a first positive voltage level; supplying direct current electrical potential to said focus electrode at a negative voltage level to focus a beam of ions from said ion source; detecting a potential beam latching condition in which said ion beam is striking said focus electrode to provide a latch detect signal; momentarily altering the voltage supplied to said filament-cathode in response to said latch detect signal to momentarily turn down the arc current to prevent said latching condition; and interrupting said monitoring and altering steps while said latch detect signal is present to maintain the filament power value at the value set during the last execution of the monitoring and altering steps;
 supplying direct current voltage between said anode and said filament-cathode characterized by substantially constant arc current therebetween and varying arc voltage on said filament-cathode; said step of supplying voltage between said anode and said filament-cathode further comprising: monitoring the value of arc current flowing between said anode and said filament-cathode; driving an arc current error signal as a function of the difference between said monitored arc current value and a preset arc current demand signal; and altering the voltage supplied to said filament-cathode as a function of said arc current error signal until said monitored arc current is equal to said arc current demand signal;
 supplying direct current electrical power to said filament-cathode;
 monitoring the value of said arc voltage; and
 altering the magnitude of electrical power supplied to said filament-cathode in response to detected changes in said arc voltage to return said arc voltage to substantially a preset reference value, said monitoring step and said altering step being carried out at regular preset intervals; and said altering step further comprising: deriving a filament power change signal as a prearranged function which includes the difference in values between said monitored arc voltage and said preset reference value multiplied by a predefined integral gain value; and altering the magnitude of electrical power supplied to said filament-cathode by the value of said filament power change signal.

19. In a system for operating an ion source and extracting an ion beam therefrom, in combination:
 an ion source having a chamber with a filament-cathode and anodes mounted within said chamber and an ion exit aperture;
 an extraction electrode mounted adjacent said ion exit aperture, a decel electrode mounted adjacent said extraction electrode, first biasing means for biasing said ion source to a first positive voltage relative to the bias on said decel electrode, second biasing means for biasing said extraction electrode to a negative voltage value substantially on the same order of magnitude as said positive voltage with limited current capacity to preclude hard sparking between said extraction electrode and said ion source, latching detect means coupled to said second biasing means for detecting a condition of substantial ion beam striking said extraction electrode which might cause latch up of the beam on said electrode; and circuit means coupled to said latching detect means and to said error circuit means to produce an output from said error circuit for a short time interval which lowers arc current to prevent or eliminate said beam latch up condition;
 arc power supply means for supply direct current electrical voltage between said anodes and said filament-cathode, including means for maintaining substantially constant arc current flowing between said anode and said filament-cathode with accompanying variations in the arc voltage of said anode;
 filament power supply means for supplying a value of direct current electrical power to said filament-cathode in response to a filament power control signal;
 means for monitoring the value of said arc voltage on filament-cathode;
 means for developing a filament power error signal as a predefined function of the difference between said arc voltage value and a reference arc voltage value; and
 means for altering the magnitude of electrical power supplied to said filament-cathode as a function of said filament power control signal to return said arc voltage to said reference arc voltage value, comprising: means coupled in circuit with said filament power supply and said filament-cathode for producing a filament current signal corresponding to the value of current flowing through said filament-cathode; means for deriving a filament voltage signal corresponding to the value of the voltage applied across said filament cathode; means receiving said filament current signal and said filament voltage signal for producing a filament power signal; means responsive to said filament power error signal for developing a filament power demand signal; and error circuit means receiving said filament power signal and said filament power demand signal for producing a control signal to said filament power supply with a magnitude proportional to the difference in values between said filament power signal and said filament power demand signal to thereby cause said filament power supply to alter the power applied to said filament until the values of said filament power signal and said filament power demand signal are equal.

* * * * *

UNITED STATES PATENT AND TRADEMARK OFFICE
CERTIFICATE OF CORRECTION

PATENT NO. : 4,754,200
DATED : June 28, 1988
INVENTOR(S) : FREDERICK PLUMB ET AL It is certified that error appears in the above—identified patent and that said Letters Patent is hereby corrected as shown below:

IN THE SPECIFICATION

In Col. 1, line 26, change "advanced" to --advances--;

In Col. 1, lines 33 & 34, change "Use Of Ion Implantation In Semiconductor Processing" to a subtitle as follows:

--<u>Use of Ion Implantation in Semiconductor Processing</u>--;

In Col. 2, line 65, change "io" to --ion--;

In Col. 3, line 47, change "acceeration" to --acceleration--;

In Col. 4, line 9, change "arac" to --arc--;

In Col. 4, line 19, change "leverl" to --level--;

In Col. 5, line 8, delete "to" and insert --in--;

In Col. 6, line 47, change "suply" to --supply--;

In Col. 7, line 29, change "hardward" to --hardware--;

UNITED STATES PATENT AND TRADEMARK OFFICE
CERTIFICATE OF CORRECTION

PATENT NO. : 4,754,200
DATED : June 28, 1988
INVENTOR(S) : FREDERICK PLUMB ET AL It is certified that error appears in the above—identified patent and that said Letters Patent is hereby corrected as shown below:

In Col. 8, line 26, change "aaspect" to --aspect--;

In Col. 10, line 50, change "extractio" to --extraction--;

In Col. 10, line 68, change "dietect" to --detect--;

In Col. 11, line 11, change "arch" to --arc--;

In Col. 11, line 21, change "acceleratio" to --acceleration--;

In Col. 12, line 2, change "inventio," to --invention,--;

In Col. 12, line 18, change "teh" to --the--;

In Col. 12, line 33, change "realy" to --relay--;

In Col. 12, line 49, change "desireable" to --desirable--;

In Col. 12, line 51, change "provisio" to --provision--;

In Col. 12, line 58, change "arrnagemnet" to --arrangement--;

UNITED STATES PATENT AND TRADEMARK OFFICE
CERTIFICATE OF CORRECTION

PATENT NO. : 4,754,200
DATED : June 28, 1988
INVENTOR(S) : FREDERICK PLUMB ET AL It is certified that error appears in the above—identified patent and that said Letters Patent is hereby corrected as shown below:

In Col. 12, line 66, change "delaatching" to --delatching--;

In Col. 13, line 38, delete "in" and insert --is--;

In Col. 14, delete the second sentence of the first paragraph, lines 3-6,

"Since there is no arc current actually flowing but arc current demand has been set at one amp, the error circuit voltage to go up to its maximum value of about 140 volts." and insert --Since there is no arc current actually flowing but arc current demand has been set at one amp, the error circuit in the arc voltage control system will cause the arc voltage to go up to its maximum value of about 140 volts.--

In Col. 14, line 9, change "pwoer" to --power--;

In Col. 14, line 17, change "teh" to --the--;

In Col. 14, line 31, change "wats" to --watts--;

In Col. 14, line 42, change "wall" to --watt--;

In Col. 14, line 42, change "unitl" to --until--;

In Col. 14, line 55, change "The" to --the--;

UNITED STATES PATENT AND TRADEMARK OFFICE
CERTIFICATE OF CORRECTION

PATENT NO. : 4,754,200
DATED : June 28, 1988
INVENTOR(S) : FREDERICK PLUMB ET AL It is certified that error appears in the above—identified patent and that said Letters Patent is hereby corrected as shown below:

In Col. 14, lines 60 and 61, delete "circumstances, after some number of loops through the main";

In Col. 14, line 68, after "whether it is less than", insert --the--;

In Col. 15, line 26, change "fromthe" to --from the--;

In Col. 15, line 27, change "haavea" to --have--;

In Col. 15, line 49, change "Thiscauses" to --This causes--;

In Col. 15, line 60, after "the arc may be out under some", insert --conditions.--;

In Col. 15, line 61, delete "circumstances under which" and insert --It is--;

In Col. 16, line 13, change "ot" to --to--;

In Col. 16, line 22, change "acutally" to --actually--;

UNITED STATES PATENT AND TRADEMARK OFFICE
CERTIFICATE OF CORRECTION

PATENT NO.   : 4,754,200
DATED        : June 28, 1988
INVENTOR(S)  : FREDERICK PLUMB ET AL It is certified that error appears in the above—identified patent and that said Letters Patent is hereby corrected as shown below:

In Col. 16, lines 25 and 26, after "voltage is changing.", start a new paragraph with "The program now calculates a new...";

In Col. 16, line 63, change "multiplies" to --multiplied--;

In Col. 17, line 21, change "prclude" to --preclude--;

In Col. 17, line 22, change "calculatio" to --calculation--;

In Col. 17, line 29, change "filaament" to --filament--;

In Col. 17, line 51, change "ahs" to --has--;

In Col. 17, line 68, change "systemand" to --system and--;

In Col. 18, line 2, change "exmaple" to --example--;

In Col. 18, line 3, change "contorl" to --control--;

In Col. 18, line 5, change "If" to --It--;

UNITED STATES PATENT AND TRADEMARK OFFICE
CERTIFICATE OF CORRECTION

PATENT NO. : 4,754,200
DATED : June 28, 1988
INVENTOR(S) : FREDERICK PLUMB ET AL It is certified that error appears in the above—identified patent and that said Letters Patent is hereby corrected as shown below:

In Col. 18, line 27, change "there" to --these--;

In Col. 18, line 60, change "io" to --ion--; and

In Col. 18, lines 62 and 63, after "circuit fabrication operations.", start a new paragraph with "It will be appreciated...".

IN THE CLAIMS

In Claim 1, Col. 19, line 8, change "modulatae" to --modulate--;

In Claim 7, Col. 19, line 55, change "cmprises" to --comprises--;

In Claim 8, Col. 19, line 65, delete "all";

In Claim 10, Col. 20, line 52, after "chamber" insert --;--;

In Claim 13, Col. 21, line 66, change "proportioal" to --proportional--;

In Claim 13, Col. 22, line 2, change "valaue" to --value--;

UNITED STATES PATENT AND TRADEMARK OFFICE
CERTIFICATE OF CORRECTION

PATENT NO. : 4,754,200
DATED : June 28, 1988
INVENTOR(S) : FREDERICK PLUMB ET AL It is certified that error appears in the above—identified patent and that said Letters Patent is hereby corrected as shown below:

In Claim 13, Col. 22, line 11, change "saif" to --said--;

In Claim 13, Col. 22, line 17, change "saif" to --said--;

In Claim 16, Col. 22, line 65, change "claim 14," to --claim 15--; and

In Claim 17, Col. 23, line 10, change "claim 15," to --claim 16--.

Signed and Sealed this

Fourteenth Day of March, 1989

*Attest:*

DONALD J. QUIGG

*Attesting Officer*    *Commissioner of Patents and Trademarks*